(12) United States Patent
Hong et al.

(10) Patent No.: US 12,414,421 B2
(45) Date of Patent: Sep. 9, 2025

(54) DISPLAY APPARATUS HAVING DISPLAY MODULE AND MANUFACTURING METHOD THEREOF

(71) Applicant: SAMSUNG ELECTRONICS CO., LTD., Suwon-si (KR)

(72) Inventors: Soonmin Hong, Suwon-si (KR); Tackmo Lee, Suwon-si (KR); Gunwoo Kim, Suwon-si (KR); Seonghwan Shin, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 351 days.

(21) Appl. No.: 18/096,332

(22) Filed: Jan. 12, 2023

(65) Prior Publication Data
US 2023/0299251 A1   Sep. 21, 2023

Related U.S. Application Data

(63) Continuation of application No. PCT/KR2022/021537, filed on Dec. 28, 2022.

(30) Foreign Application Priority Data

Mar. 17, 2022   (KR) .......................... 10-2022-0033439

(51) Int. Cl.
*H10H 20/857*   (2025.01)
*H01L 25/075*   (2006.01)
(Continued)

(52) U.S. Cl.
CPC ....... *H10H 20/857* (2025.01); *H01L 25/0753* (2013.01); *H10H 20/85* (2025.01);
(Continued)

(58) Field of Classification Search
CPC .............. H10H 20/85; H10H 20/8506; H10H 20/8508; H10H 20/853; H10H 29/85; H10H 29/8506; H10H 29/8508; H10H 29/853
See application file for complete search history.

(56) References Cited

U.S. PATENT DOCUMENTS 5,995,179 A    11/1999  Tamura et al.
9,172,000 B2   10/2015  Kim et al.
(Continued)

FOREIGN PATENT DOCUMENTS

JP   3252775 B2      2/2002
JP   2011-170382 A   9/2011
(Continued)

OTHER PUBLICATIONS

Communication issued Mar. 12, 2025 by the European Patent Office in European Patent Application No. 22932421.5.

*Primary Examiner* — David A Zarneke
(74) *Attorney, Agent, or Firm* — Sughrue Mion, PLLC

(57) ABSTRACT

A display module includes: a substrate including a mounting surface on which a plurality of inorganic light-emitting diodes emitting light in a first direction are mounted, a side surface, and a rear surface being opposite to the mounting surface; a front cover bonded with the mounting surface and covering the mounting surface in the first direction; a metal plate bonded with the rear surface; a side cover surrounding the side surface; and a side end member covering at least one portion of the side cover and extending in a second direction being orthogonal to the first direction along the side surface, wherein the side end member includes a body extending in the second direction, and a plurality of ribs extending from the body in the first direction and arranged at intervals along the second direction.

20 Claims, 15 Drawing Sheets

(51) Int. Cl.
  *H10H 20/85* (2025.01)
  *H10H 20/853* (2025.01)
  *H10H 29/14* (2025.01)
  *H10H 29/85* (2025.01)
  *H10H 29/853* (2025.01)

(52) U.S. Cl.
  CPC .... *H10H 20/8506* (2025.01); *H10H 20/8508* (2025.01); *H10H 20/853* (2025.01); *H10H 29/142* (2025.01); *H10H 29/85* (2025.01); *H10H 29/8506* (2025.01); *H10H 29/8508* (2025.01); *H10H 29/853* (2025.01)

(56) References Cited

U.S. PATENT DOCUMENTS

| | | | |
|---|---|---|---|
| 10,036,911 B2* | 7/2018 | Cho | G02F 1/133308 |
| 10,468,396 B2* | 11/2019 | Kim | H10D 86/451 |
| 10,811,579 B2 | 10/2020 | Scholz et al. | |
| 10,943,969 B2* | 3/2021 | Kwon | H10K 59/131 |
| 11,837,589 B2* | 12/2023 | Lim | G09F 9/3026 |
| 11,881,473 B2* | 1/2024 | Lee | H10H 20/01 |
| 2017/0090230 A1* | 3/2017 | Yoon | G02F 1/133308 |
| 2017/0140679 A1* | 5/2017 | Tomoda | G09F 9/3026 |
| 2017/0286044 A1* | 10/2017 | Kim | G09G 3/3208 |
| 2018/0190631 A1 | 7/2018 | Kim et al. | |
| 2020/0350476 A1 | 11/2020 | Lee et al. | |
| 2021/0183837 A1 | 6/2021 | Shin et al. | |
| 2021/0202449 A1 | 7/2021 | Shin et al. | |
| 2022/0084994 A1 | 3/2022 | Shin | |
| 2023/0126724 A1 | 4/2023 | Hong et al. | |
| 2023/0299251 A1* | 9/2023 | Hong | H10H 29/142 |
| 2023/0328903 A1 | 10/2023 | Choi et al. | |

FOREIGN PATENT DOCUMENTS

| | | |
|---|---|---|
| KR | 10-1673955 B1 | 11/2016 |
| KR | 10-2020-0036029 A | 4/2020 |
| KR | 10-2020-0127815 A | 11/2020 |
| KR | 10-2021-0141146 A | 11/2021 |
| KR | 10-2023-0060347 A | 5/2023 |
| WO | 2022/019348 A1 | 1/2022 |

* cited by examiner

DISPLAY APPARATUS HAVING DISPLAY MODULE AND MANUFACTURING METHOD THEREOF

CROSS-REFERENCE TO RELATED APPLICATIONS

This application is a by-pass continuation application of International Application No. PCT/KR2022/021537, filed on Dec. 28, 2022, which is based on and claims priority to Korean Patent Application No. 10-2022-033439, filed on Mar. 17, 2022 in the Korean Intellectual Property Office, the disclosures of which are incorporated by reference herein in their entireties.

BACKGROUND

1. Field

The disclosure relates to a display apparatus for displaying an image by coupling modules in which self-emissive inorganic light-emitting diodes are mounted on substrates.

2. Description of the Related Art

A display apparatus is a kind of output apparatus for visually displaying images and data information, such as characters, figures, etc.

A display apparatus may include a liquid crystal panel with a backlight or an Organic Light-Emitting Diode (OLED) panel configured with a film of an organic compound that itself emits light in response to current. A liquid crystal panel requires a backlight because itself does not emit light and may have a slow response time and high power consumption. Accordingly, it may be challenging to make a compact liquid crystal panel. An OLED panel requires no backlight and so may be thin. However, an OLED panel may be vulnerable to a burn-in phenomenon in which certain area of the screen remains as it is after the screen changes to another screen due to short life cycles of sub pixels.

A micro light-emitting diode panel (a micro LED panel or μLED panel) in which inorganic light-emitting diodes are mounted on a substrate and the inorganic light-emitting diodes themselves are used as pixels. The micro light-emitting diode panel may be flat configured with a plurality of inorganic LEDs each having a size of 100 micrometers or less.

The micro LED panel does not cause the burn-in phenomenon of OLEDs as inorganic light-emitting diodes that are self-emissive devices, in addition to having excellent brightness, resolution, consumption power, and durability.

The micro LED panel provides better contrast, response time, and energy efficiency than the LCD panel requiring the backlight. Micro LEDs that are inorganic light-emitting diodes have higher brightness, higher light-emitting efficiency, and a longer lifespan than OLEDs although both the OLEDs and micro LEDs have high energy efficiency.

In addition, the micro LEDs may achieve a substrate-level display modulation by arranging LEDs in units of pixels on a circuit board, and provide various resolutions and screen sizes of display according to the customer's order.

SUMMARY

Provided are a display apparatus, a display module, and a manufacturing method thereof suitable for enlargement and protection of a display apparatus against static electricity.

According to an aspect of the disclosure, a display module includes: a substrate having a mounting surface on which a plurality of inorganic light-emitting diodes are mounted, a side surface, and a rear surface being opposite to the mounting surface; a front cover bonded with the mounting surface of the substrate and covering the mounting surface in the first direction; a metal plate bonded with the rear surface of the substrate; a side cover surrounding the side surface of the substrate; and a side end member covering at least one portion of the side cover, and extending along the side surface of the substrate in a second direction that is orthogonal to the first direction, wherein the side end member includes a body extending in the second direction, and a plurality of ribs extending from the body in the first direction and arranged at intervals along the second direction.

The side cover may include: a side end portion forming a side end of the side cover, and a rear portion extending in a rear direction from the side end portion with respect to the first direction and positioned at an inner location than the side end portion in a third direction that is orthogonal to the first direction and the second direction, and the body may be provided on the rear portion in the third direction.

The plurality of ribs may be provided on the side end portion.

The plurality of ribs may be provided on the side end portion in the third direction and the rear portion in the third direction.

The body may be formed at rear ends of the plurality of ribs.

A length of each of the plurality of ribs in the second direction may be equal to or less than a length of a separation distance between the plurality of ribs in the second direction.

A conductivity of the side end member may be greater than a conductivity of the side cover.

A color of the side end member may be a black color.

The side end member may include a metal material.

According to an aspect of the disclosure, a display module includes: a substrate having a mounting surface on which a plurality of inorganic light-emitting diodes are mounted, a side surface, and a rear surface being opposite to the mounting surface; a front cover bonded with the mounting surface of the substrate and covering the mounting surface of the substrate; a metal plate bonded with the rear surface of the substrate; a side cover surrounding the side surface of the substrate; and a side end member covering at least one portion of the side cover and at least one portion of the metal plate, the side end member including a first end portion, a second end portion spaced from the first end portion in a direction in which the mounting surface faces, and a side end portion extending from the first end portion to the second end portion and forming a side end; wherein the first end portion of the side end member covers at least one portion of the side end of the side cover, the second end portion of the side end member contacts the metal plate and is grounded to the metal plate, and the side end portion include mountains and valleys alternately arranged in the direction in which the mounting surface faces.

A mountain from among the mountains may be provided at the first end portion, and a valley among the valleys may be provided at the second end portion.

A conductivity of the side end member may be greater than a conductivity of the side cover.

A height of each of the mountains and a depth of each of the valleys are the same.

The mountains and the valleys may have a same volume.

According to an aspect of the disclosure, a display apparatus includes: a display module array including a plurality of display modules arranged in a matrix, wherein each of the plurality of display modules includes: a substrate having a mounting surface on which a plurality of inorganic light-emitting diodes are mounted, a side surface, and a rear surface being opposite to the mounting surface; a front cover bonded with the mounting surface of the substrate and covering the mounting surface of the substrate; a metal plate bonded with the rear surface of the substrate; a side cover surrounding the side surface of the substrate; and a side end member covering at least one portion of the side cover and extending along the side surface of the substrate in a second direction that is orthogonal to the first direction, wherein the side end member includes a body extending in the second direction, and a plurality of ribs extending from the body in the first direction and arranged at intervals along the second direction.

The plurality of display modules may include a first display module and a second display module, and the side end member of the first display module may engage the side end member of the second display module.

A length of each of the plurality of ribs in the second direction may be equal to or less than a length of a separation distance between the plurality of ribs in the second direction.

The side cover may include: a side end portion forming a side end of the side cover, and a rear portion extending in a rear direction from the side end portion with respect to the first direction and in a third direction that is orthogonal to the first direction and the second direction, and the body may be provided on the rear portion.

The plurality of ribs may be provided on the side end portion.

The plurality of ribs may be provided on the side end portion in the third direction and the rear portion in the third direction.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
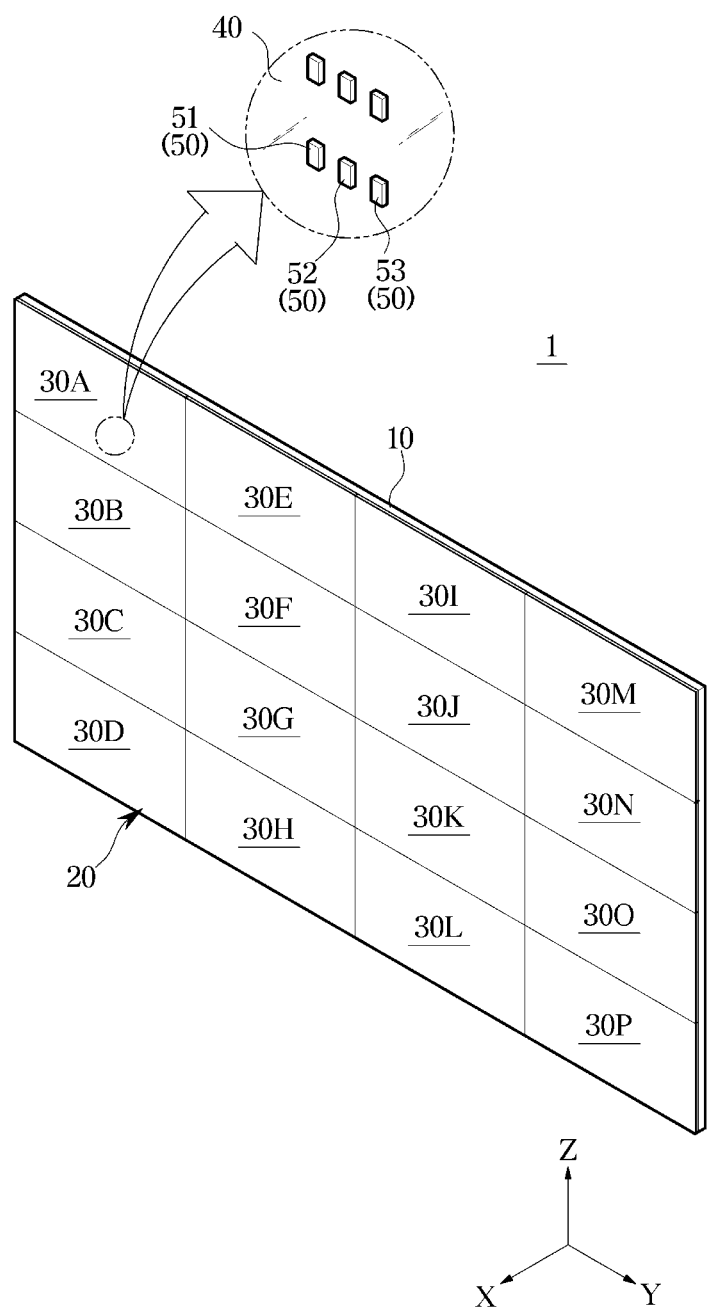
FIG. 1 shows a display apparatus according to an embodiment of the disclosure.

The embodiments described in the present specification are only the most preferred embodiments of the disclosure and do not represent all of the technical idea of the disclosure. It should be understood that various equivalents or variations that may be substituted for them at the time of the present application belong to the scope of rights of the disclosure.

It is to be understood that the singular forms "a," "an," and "the" include plural referents unless the context clearly dictates otherwise. In the drawings, for ease of understanding, the shapes or sizes of components may be more or less exaggeratedly shown.

It will be understood that when the terms "includes," "comprises," "including," and/or "comprising," when used in this specification, specify the presence of stated features, figures, steps, operations, components, members, or combinations thereof, but do not preclude the presence or addition of one or more other features, figures, steps, operations, components, members, or combinations thereof.

Also, in this specification, the meaning of 'identical' may include similar in attribute or similar within a certain range. Also, the term 'identical' means 'substantially identical'. The meaning of 'substantially identical' needs to be understood that a value falling within the margin of error in manufacturing or a value corresponding to a difference within a meaningless range with respect to a reference value is included in the range of 'identical'.

Throughout the disclosure, the expression "at least one of a, b or c" indicates only a, only b, only c, both a and b, both a and c, both b and c, all of a, b, and c, or variations thereof.

Hereinafter, embodiments of the disclosure will be described in detail with reference to the accompanying drawings.

Figure 2:
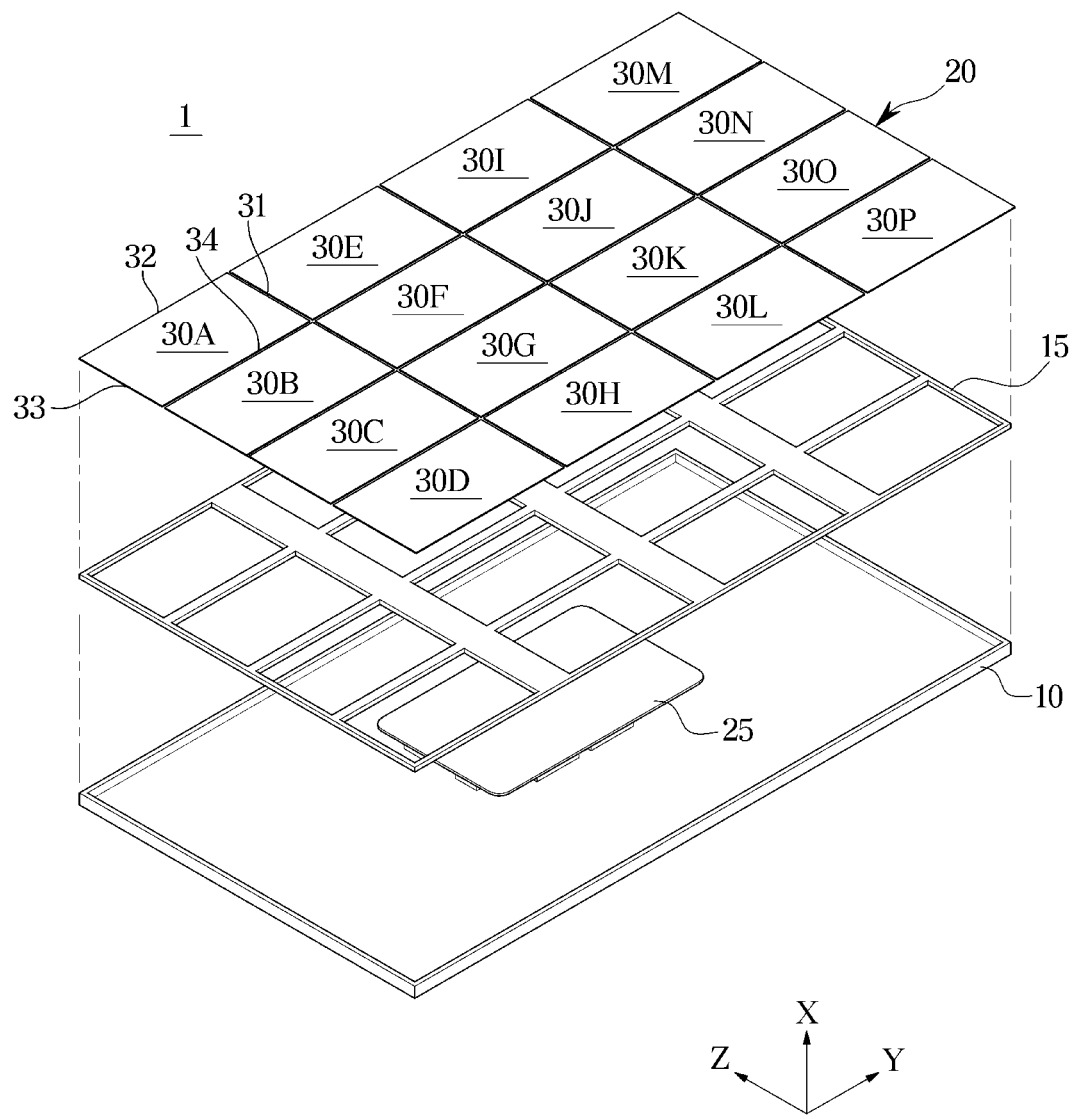
FIG. 2 is an exploded view showing main components of the display apparatus of FIG. 1.
Figure 3:
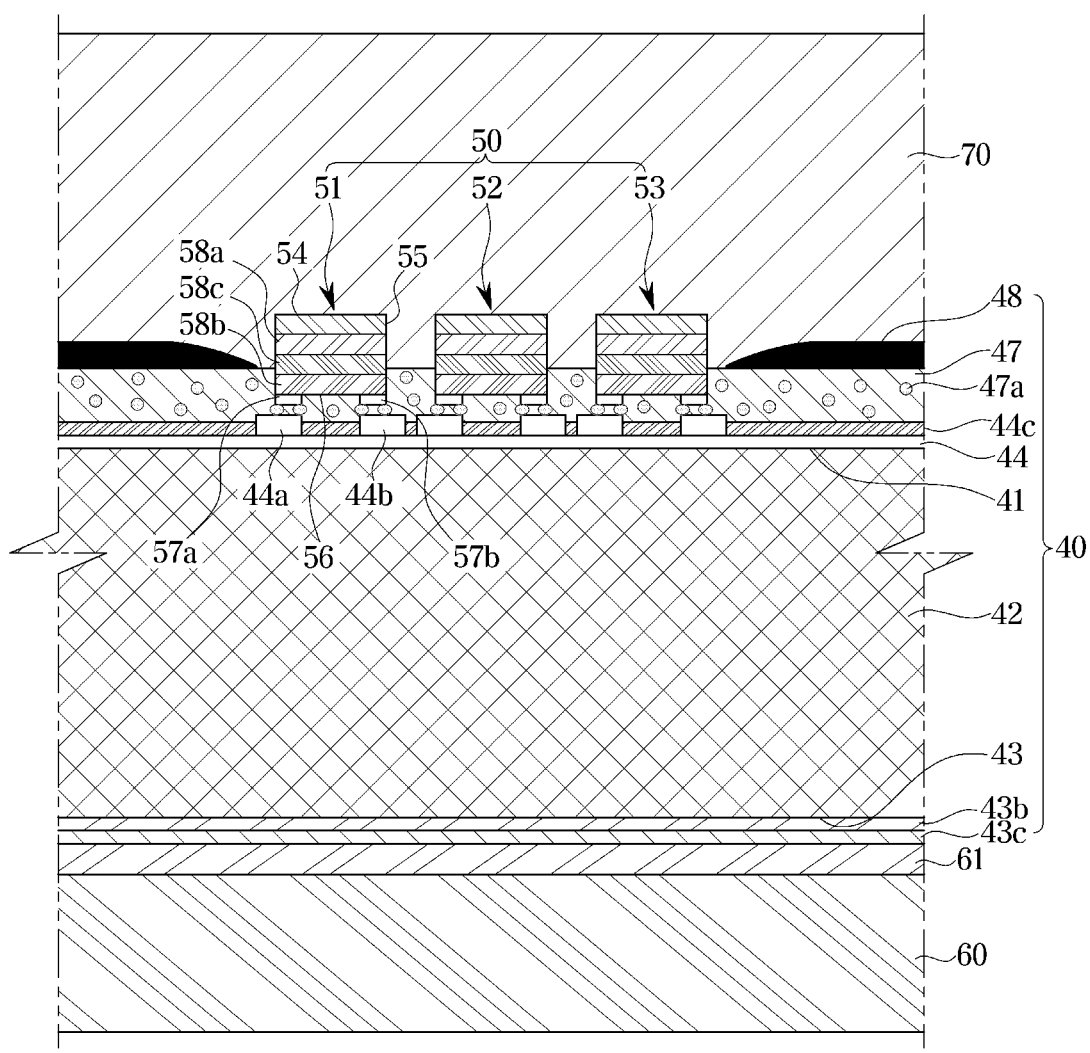
FIG. 3 is an enlarged cross-sectional view showing some components of a display module shown in FIG. 1.
Figure 4:
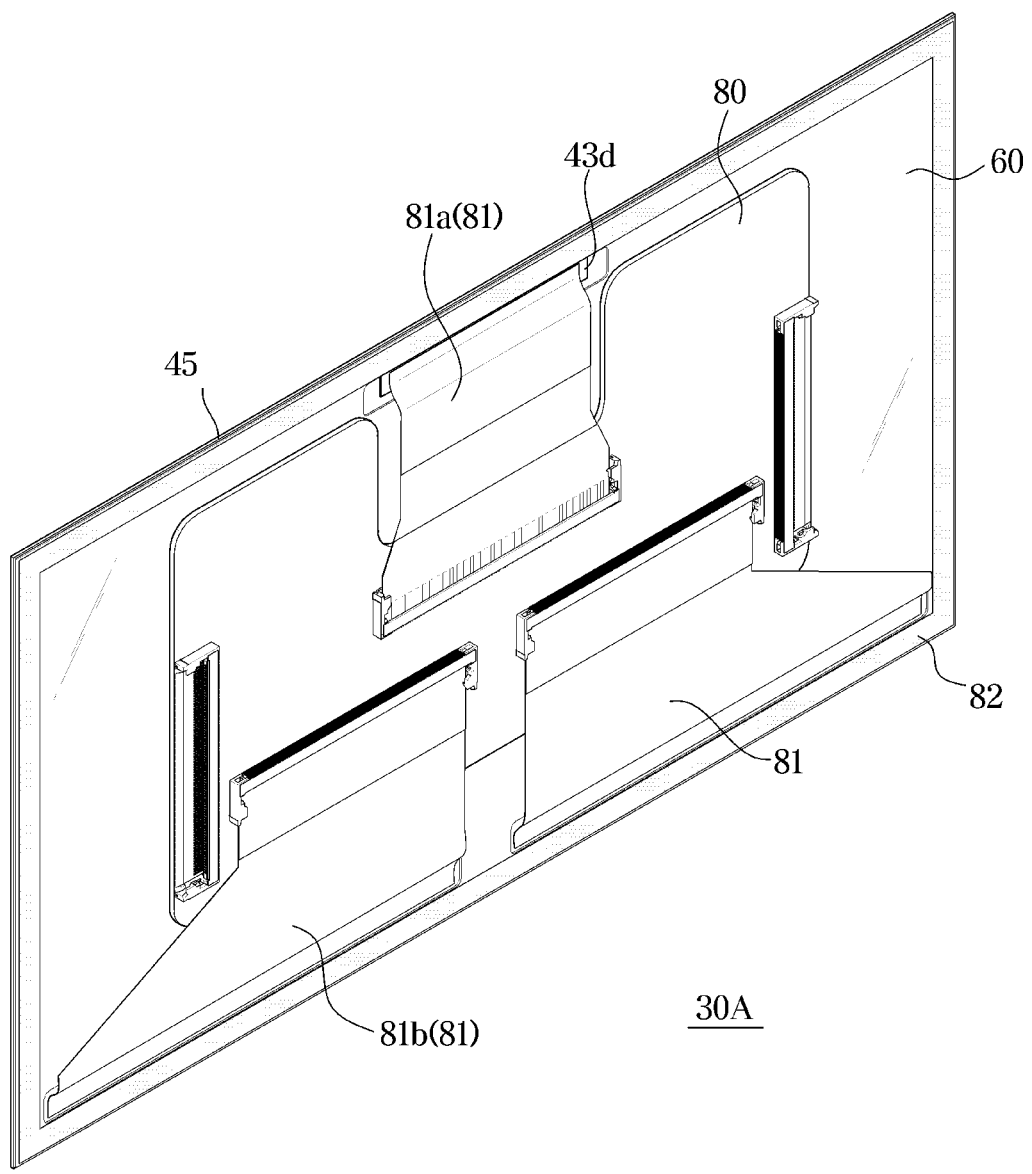
FIG. 4 is a rear perspective view of the display module of the display apparatus shown in FIG. 1.
Figure 5:
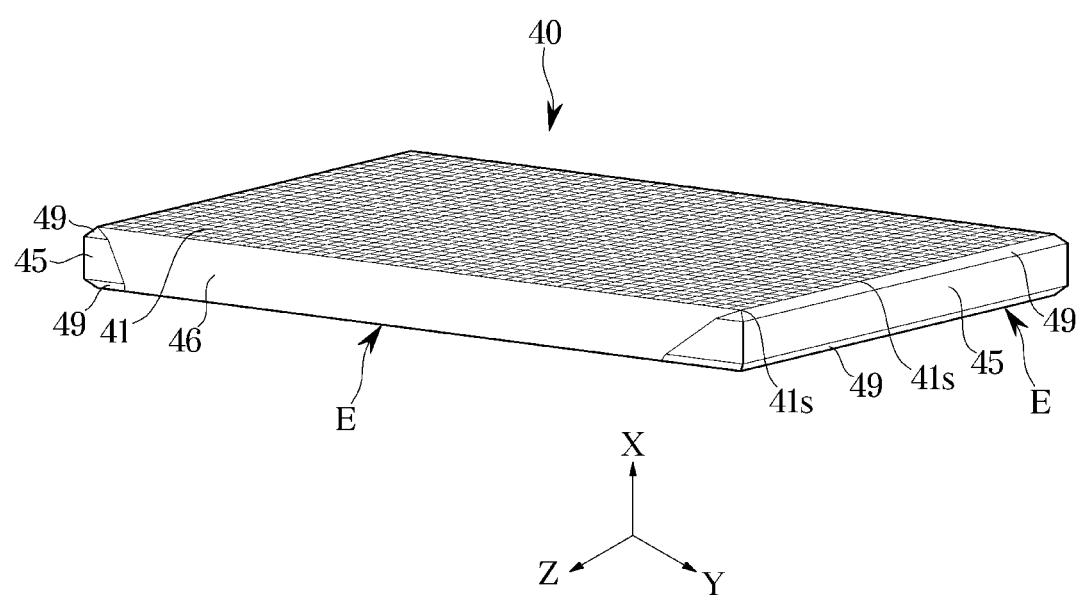
FIG. 5 is a perspective view of some components of the display module shown in FIG. 1.

FIG. 1 shows a display apparatus according to an embodiment of the disclosure, FIG. 2 is an exploded view showing main components of the display apparatus of FIG. 1, FIG. 3 is an enlarged cross-sectional view showing some components of a display module shown in FIG. 1, FIG. 4 is a rear perspective view of the display module of the display apparatus shown in FIG. 1, and FIG. 5 is a perspective view of some components of the display module shown in FIG. 1.

Some components of a display apparatus 1, including a plurality of inorganic light-emitting diodes 50, shown in the drawings may be micro-scale components each having a size of several micrometers (μm) to hundreds of micrometers (μm). For convenience of description, the scale of some components, such as, for example, the plurality of inorganic light-emitting diodes 50, a black matrix 48, etc., may be exaggerated in scale and shown in a larger size in the drawings.

The display apparatus 1 may be, for example, an apparatus for displaying information, materials, data, etc. in characters, figures, graphs, images, etc., and the display apparatus 1 may be implemented as a television (TV), a personal computer (PC), a mobile device, a digital signage, etc.

According to an embodiment, as shown in FIGS. 1 and 2, the display apparatus 1 may include a display panel 20 for displaying an image. The example embodiment may include a power supply for supplying power to the display panel 20, a main board 25 for controlling overall operations of the display panel 20, a frame 15 supporting the display panel 20, and a rear cover 10 covering a rear surface of the frame 15.

The display panel 20 may include a plurality of display modules 30A to 30P, a driving board for driving the display modules 30A to 30P, and a timing controller (TOCN) board for generating timing signals for controlling the display modules 30A to 30P.

The rear cover 10 may support the display panel 20. The rear cover 10 may be, for example, installed on a floor through a stand or mounted on a wall through a hanger and other installations or arrangements may be used in example embodiments.

The plurality of display modules 30A to 30P may be arranged adjacent to one another in up, down, left, and right directions in example embodiments. The plurality of display modules 30A to 30P may be arranged in a M*N matrix form. In the current embodiment, sixteen (16) display modules 30A to 30P may be arranged in a 4*4 matrix form. However, the number and arrangement of the plurality of display modules 30A to 30P are not limited thereto. Additionally, the various display modules 30A to 30P may be placed at different locations from that shown in FIG. 1. For example, the locations of the second display module 30E and the third display module 30B may be switched from that shown in FIG. 1.

The plurality of display modules 30A to 30P may be mounted on the frame 15. The plurality of display modules 30A to 30P may be mounted on the frame 15 by various known methods, such as, for example, a magnetic force generated by a magnet or a mechanical insert structure. A rear side of the frame 15 may be coupled with the rear cover 10, and the rear cover 10 may form a rear outer appearance of the display apparatus 1.

The rear cover 10 may include a metal material. Accordingly, heat generated from the plurality of display modules 30A to 30P and the frame 15 may be easily transferred to the rear cover 10, which raises heat dissipation efficiency of the display apparatus 1.

As such, the display apparatus 1 according to an embodiment may implement a large screen by tiling the plurality of display modules 30A to 30P.

In other embodiments, instead of a matrix including a plurality of display modules 30A to 30P, a single display module may be applied to a display apparatus. For example, in an embodiment, a single one of display modules 30A to 30P may be installed in and applied to devices such as a wearable device, a portable device, a handheld device, and various electronic products or electronic parts requiring a display. According to other embodiments, a matrix utilizing a plurality of display modules 30A to 30P may be assembled and arranged in a matrix and used for these devices. The display modules 30A to 30P may be applied to a display apparatus, such as a monitor for PC, a high-resolution TV, a signage, an electronic display, etc. A single display module 30A to 30P may be used or a plurality of the modules 30A to 30P may be assembled and arranged in a matrix. The plurality of display modules 30A to 30P may have the same or similar configuration. Accordingly, the following description about a display module may be applied in the same way to all the other display modules.

Hereinafter, a first display module 30A of the plurality of display modules 30A to 30P will be described.

Components of the plurality of display modules 30A to 30P, a display module 30, a substrate 40, and a front cover 70 will be representatively described.

Embodiments of the first display module 30A of the plurality of display modules 30A to 30P and a second display module 30E being adjacent to the first display module 30A in a second direction Y or a third display module 30B being adjacent to the first display module 30A in a third direction Z will also be described as necessary.

Embodiments of a fourth display module 30I being adjacent to the second display module 30E in the second direction Y and being opposite to the first display module 30 A with respect to the second display module 30E, and a fifth display module 30C being adjacent to the third display module 30B in the third direction Z and being opposite to the first display module 30A with respect to the third display module 30B will also be described as necessary.

The first display module 30A may be formed in a quadrangle shape. The first display module 30A may be formed in, for example, a rectangle type or a square shape.

Accordingly, the first display module 30A may include edges 31, 32, 33, and 34 positioned in upper, lower, left, and right directions with respect to a first direction X which is a front direction.

As shown in FIG. 3, each of the plurality of display modules 30A to 30P of the embodiment may include the substrate 40, and a plurality of inorganic light-emitting diodes 50 mounted on the substrate 40. The plurality of inorganic light-emitting diodes 50 may be mounted on a mounting surface 41 of the substrate 40 toward the first direction X. In FIG. 3, for convenience of description, a thickness in first direction X of the substrate 40 is shown at an exaggerated scale.

The substrate 40 may be formed in a quadrangle shape. As described above, because each of the plurality of display modules 30A to 30P is formed in a quadrangle shape, the substrate 40 may also be formed in a quadrangle shape correspondingly.

The substrate 40 may be formed in a quadrangle shape such as, for example, a square shape or a rectangular shape.

Accordingly, in the example embodiment of the first display module 30A, the substrate 40 may include four edges E corresponding to the edges 31, 32, 33, and 34 of the first display module 30A, positioned in the upper, lower, left, and right directions with respect to the first direction X which is the front direction (see FIG. 5).

The substrate 40 may include a substrate body 42, a mounting surface 41 forming one surface of the substrate body 42, a rear surface 43 forming the other surface of the substrate body 42 and being opposite to the mounting surface 41, and a side surface 45 positioned between the mounting surface 41 and the rear surface 43.

The side surface 45 may form a side end of the substrate 40 in the second direction Y and the third direction Z that are orthogonal to the first direction X.

The substrate 40 may include a chamfer portion 49 formed between the mounting surface 41 and the side surface 45 and between the rear surface 43 and the side surface 45.

The chamfer portion 49 may prevent, upon an arrangement of the plurality of display modules 30A to 30P, each substrate 40 from colliding with another one(s) and being damaged.

The edges E of the substrate 40 may include the side surface 45 and the chamfer portion 49.

The substrate 40 may include a thin film transistor (TFT) layer 44 formed on the substrate body 42 to drive the inorganic light-emitting diodes 50. The substrate body 42 may include a glass substrate. That is, the substrate 40 may include a chip on glass (COG) type substrate. On the substrate 40, a first pad electrode 44a and a second pad electrode 44b may be formed to electrically connect the inorganic light-emitting diodes 50 with the TFT layer 44.

TFTs constituting the TFT layer 44 are not limited to specific structures or types, and may be implemented as various embodiments. TFTs of the TFT layer 44 according to an embodiment may be implemented as, for example, low temperature poly silicon (LTPS) TFTs, oxide TFTs, Si (poly silicon or a-silicon) TFTs, organic TFTs, or graphene TFTs.

Also, the TFT layer 44 may be replaced with complementary metal-oxide semiconductor (CMOS) type, n-type MOSFET, or p-type MOSFET transistors, in a case in which the substrate body 42 of the substrate 40 is a silicon wafer.

The plurality of inorganic light-emitting diodes 50 may be formed of an inorganic material, and each of the inorganic light-emitting diodes 50 may have sizes of several micrometers (μm) to hundreds of micrometers (μm) in width, length, and height. A micro inorganic light-emitting device may have a shorter side length of 100 μm or less of a width, length, or height. The inorganic light-emitting diodes 50 may be picked up from a sapphire or silicon wafer and then directly transferred onto the substrate 40. The plurality of inorganic light-emitting diodes 50 may be picked up and conveyed through an electrostatic method using an electrostatic head or a stamp method using an elastic polymer material, such as PDMS or silicon, for example, as a head.

Each of the plurality of inorganic light-emitting diodes 50 may be a light-emitting structures including an n-type semiconductor 58a, an active layer 58c, a p-type semiconductor 58b, a first contact electrode 57a, and a second contact electrode 57b.

For example, any one of the first contact electrode 57a or the second contact electrode 57b may be electrically connected with the n-type semiconductor 58a, and the other one may be electrically connected with the p-type semiconductor 58b.

The first contact electrode 57a and the second contact electrode 57b may be flip chip type electrodes arranged horizontally toward the same direction (an opposite direction of a light-emitting direction).

Each inorganic light-emitting device 50 may include a light-emitting surface 54 positioned toward the first direction X upon being mounted on the mounting surface 41. A side surface 55, and a bottom surface 56 are opposite to the light-emitting surface 54. The first contact electrode 57a and the second contact electrode 57b may be formed on the bottom surface 56.

That is, the first and second contact electrodes 57a and 57b of the inorganic light-emitting device 50 may be opposite to the light-emitting surface 54, and accordingly, the first and second contact electrodes 57a and 57b may be positioned in the opposite direction of the light-emitting direction.

The first and second contact electrodes 57a and 57b may face the mounting surface 41, and be electrically connected with the TFT layer 44. Also, the light-emitting surface 54 through which light is irradiated may be positioned in an opposite direction of the direction in which the first and second contact electrodes 57a and 57b are positioned.

Accordingly, light generated by the active layer 58c may be irradiated toward the first direction X through the light-emitting surface 54, without any interference by the first or second contact electrode 57a or 57b.

That is, the first direction X may be defined as a direction in which the light-emitting surface 54 is positioned to irradiate light.

The first contact electrode 57a and the second contact electrode 57b may be electrically connected respectively with the first pad electrode 44a and the second pad electrode 44b formed on the mounting surface 41 of the substrate 40.

The inorganic light-emitting device 50 may be connected directly with the first and second pad electrodes 44a and 44b through an anisotropic conductive layer 47 or a bonding material such as a solder.

On the substrate 40, the anisotropic conductive layer 47 may be formed to mediate an electrical connection between the first and second contact electrodes 57a and 57b and the first and second pad electrodes 44a and 44b. The anisotropic conductive layer 47 may be formed by applying an anisotropic conductive adhesive on a protective film, and have a structure in which conductive balls 47a are distributed in an adhesive resin. Each conductive ball 47a may be a conductive sphere surrounded by a thin insulating film, and as a result of breaking of the insulating film by pressure, the conductive ball 47a may electrically connect a conductor with another one.

The anisotropic conductive layer 47 may include an anisotropic conductive film (ACF) being in a form of a film, and an anisotropic conductive paste (ACP) being in a form of a paste.

In an embodiment, the anisotropic conductive layer 47 may be provided as an anisotropic conductive film.

The insulating films of the conductive balls 47a may be broken by pressure applied to the anisotropic conductive layer 47 upon mounting of the plurality of inorganic light-emitting diodes 50 on the substrate 40. As a result, the first and second contact electrodes 57a and 57b of the inorganic light-emitting diodes 50 may be electrically connected with the first and second pad electrodes 44a and 44b of the substrate 40.

In some embodiments, the plurality of inorganic light-emitting diodes 50 may be, for example, mounted on the substrate 40 through a solder, instead of the anisotropic conductive layer 47. By performing a reflow process after arranging the inorganic light-emitting diodes 50 on the substrate 40, the inorganic light-emitting diodes 50 may be bonded on the substrate 40.

The plurality of inorganic light-emitting diodes 50 may include a red light-emitting device 51, a green light-emitting device 52, and a blue light-emitting device 53. The inorganic light-emitting diodes 50 may be mounted in unit of a group including a series of a red light-emitting device 51, a green light-emitting device 52, and a blue light-emitting device 53 on the mounting surface 41 of the substrate 40. The series of the red light-emitting device 51, the green light-emitting device 52, and the blue light-emitting device 53 may form a pixel. In this case, each of the red light-emitting device 51, the green light-emitting device 52, and the blue light-emitting device 53 may form a sub pixel.

The red light-emitting device 51, the green light-emitting device 52, and the blue light-emitting device 53 may be aligned with preset intervals, as in the current embodiment. In other embodiments, the red light-emitting device 51, the green light-emitting device 52, and the blue light-emitting device 53 may be arranged in other arrangements such as, for example, a triangular arrangement.

The substrate 40 may include a light absorbing layer 44c for absorbing external light to improve contrast. The light absorbing layer 44c may be formed on the entire of the mounting surface 41 of the substrate 40. The light absorbing layer 44c may be formed between the TFT layer 44 and the anisotropic conductive layer 47.

The plurality of display modules 30A to 30P may further include the black matrix 48 formed between the plurality of inorganic light-emitting diodes 50.

The black matrix 48 may function to supplement the light absorbing layer 44c formed on the entire of the mounting surface 41 of the substrate 40. That is, the black matrix 48 may improve contrast of a screen by absorbing external light such that the substrate 40 is shown to be black.

The black matrix 48 may have a black color.

According to the current embodiment, the black matrix 48 may be positioned between pixels each formed by a series of a red light-emitting device 51, a green light-emitting device 52, and a blue light-emitting device 53. In other embodiments, the black matrix 48 may be formed more finely to partition the red light-emitting device 51, the green light-emitting device 52, and the blue light-emitting device 53 that are sub pixels.

The black matrix 48 may be formed in a shape of a lattice having a horizontal pattern and a vertical pattern to be positioned between the pixels.

The black matrix 48 may be formed, for example, by applying a light absorbing ink on the anisotropic conductive layer 47 through an ink-jet process and then hardening the light absorbing ink or by coating the anisotropic conductive layer 47 with a light absorbing film.

That is, in embodiments, the black matrix 48 may be formed in areas between the plurality of inorganic light-emitting diodes 50, in which none of the plurality of inorganic light-emitting diodes 50 is mounted, on the anisotropic conductive layer 47 formed on the entire of the mounting surface 41.

Each of the plurality of display modules 30A to 30P may include a front cover 70 positioned in the front direction X on the mounting surface 41 of the display module 30A to 30P to cover the mounting surface 41.

Figure 6:
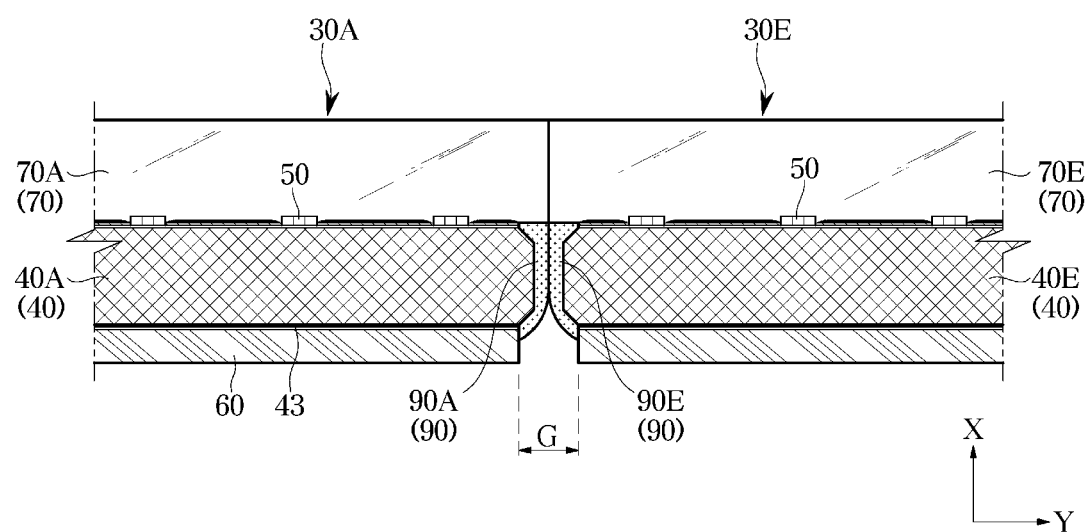
FIG. 6 is a cross-sectional view of some components of the display apparatus shown in FIG. 1, taken along a second direction.
Figure 7:
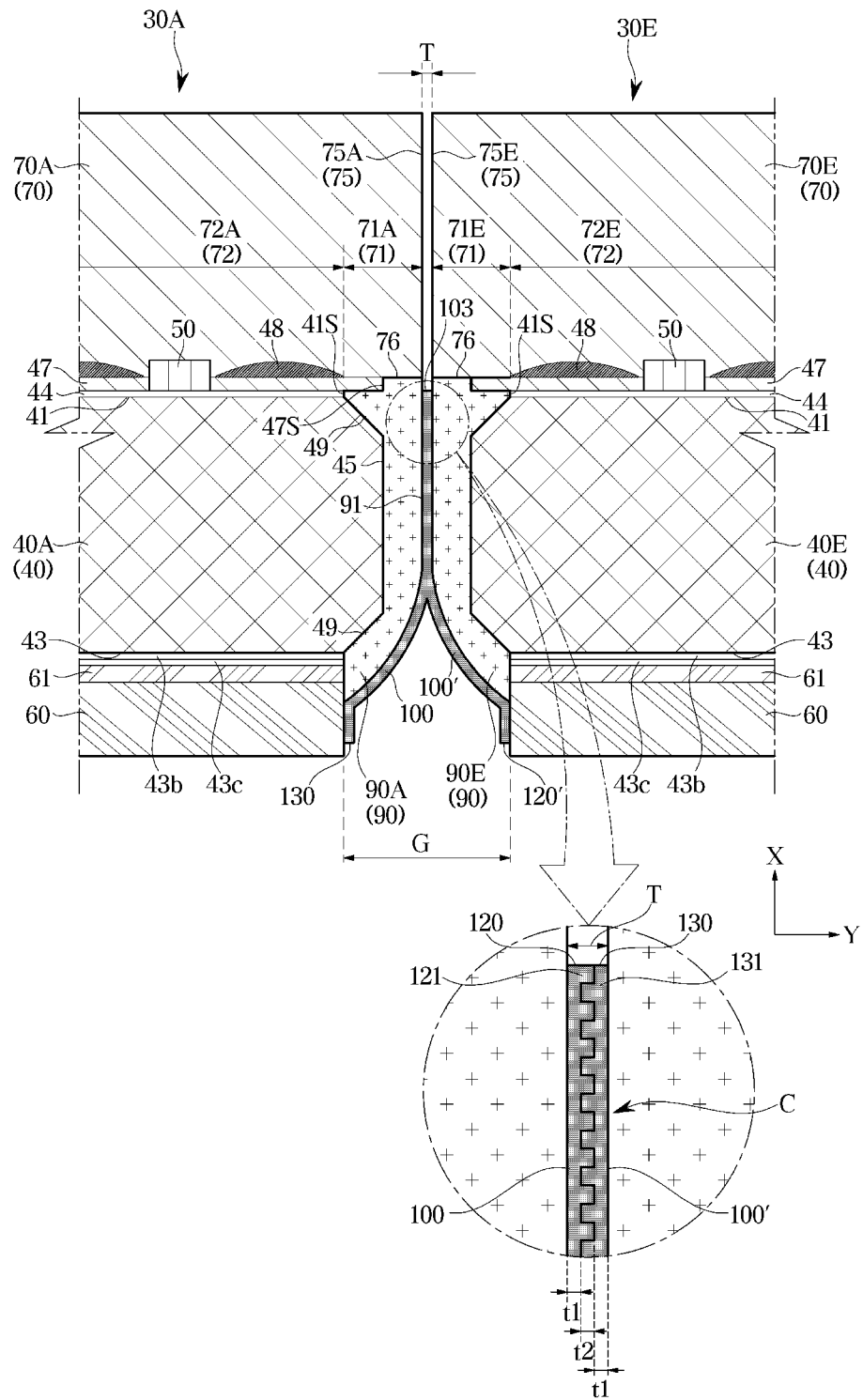
FIG. 7 is an enlarged cross-sectional view of the some components shown in FIG. 6.

A plurality of front covers 70 may be respectively formed on the plurality of display modules 30A to 30P in the first direction X (see FIGS. 6 and 7).

The plurality of display modules 30A to 30P may be assembled with each other after the front covers 70 are respectively formed on the display modules 30A to 30P. That is, in an example of the first display module 30A and the second display module 30E among the plurality of display modules 30A to 30P, a first front cover 70A may be formed on the mounting surface 41 of the first display module 30A and a second front cover 70B may be formed on the mounting surface 41 of the second display module 30E.

The front cover 70 may cover the substrate 40 to protect the substrate 40 against an external force or outside water.

A plurality of layers (not shown) of the front cover 70 may be provided as functional films having optical performance. The plurality of layers will be described in detail, below.

A part of the plurality of layers of the front cover 70 may include a base layer (not shown) formed of an optical clear resin (OCR). The base layer (not shown) may support the other layers (not shown). The OCR may be in a very transparent state as the OCR may have a transmittance of 90% or more.

The OCR may improve visibility and image quality by raising transmittance through a low reflection property. That is, in a structure having an air gap, light loss occurs due to a refractive index difference between a film layer and an air layer. However, in a structure having an OCR, such a refractive index difference may be reduced to decrease light loss, resulting in an improvement of visibility and image quality.

That is, the OCR may improve image quality, in addition to protecting the substrate 40.

For example, a part of the plurality of layers of the front cover 70 may include an adhesive layer for bonding the front cover 70 with the mounting surface 41 of the substrate 40.

The front cover 70 may have a height that is greater than or equal to a preset height in the first direction X in which the mounting surface 41 or the light-emitting surface 54 faces.

The front cover 70 formed on the substrate 40 may have a height capable of sufficiently filling a gap that may be formed between the plurality of inorganic light-emitting diodes 50 with respect to the front cover 70.

Each of the plurality of display modules 30A to 30P may include a metal plate 60 positioned on a rear surface 43 of the substrate 40.

Also, each of the plurality of display modules 30A to 30P may include a rear adhesive tape 61 positioned between the rear surface 43 of the substrate 40 and the metal plate 60 to bond the rear surface 43 with the metal plate 60.

The rear adhesive tape 61 may be a double-sided adhesive tape. However, the rear adhesive tape 61 is not limited to a double-sided adhesive tape. Also, in some embodiments, an adhesive, bonding agent or other material, structure or method for bonding the metal plate 60 with the rear surface 43 of the substrate 40 may be used in place of or additionally to the rear adhesive tape 61. For example, an adhesive layer that is not a tape may be used in some embodiments instead of or in addition to the rear adhesive tape 61. The plurality of inorganic light-emitting diodes 50 may be electrically connected with a pixel driving wiring) formed on the mounting surface 41, and an upper wiring layer extending through the side surface 45 of the substrate 40 and formed with a pixel driving wiring.

The upper wiring layer may be formed below the anisotropic conductive layer 47. The upper wiring layer may be electrically connected with a side wiring 46 formed on the side surface 45 of the substrate 40. The side wiring 46 may be provided in a form of a thin film. The side wiring 46 may include a coating member 46a surrounding the side wiring 46 to prevent the side wiring 46 from being exposed to outside and damaged (see FIG. 8).

A left-right direction of the display apparatus 1, which is orthogonal to the first direction X being a front direction from the display apparatus 1, is a second direction Y. An up-down direction of the display apparatus 1, which is orthogonal to the first direction X and the second direction Y, is a third direction Z. The side wiring 46 may extend to the rear surface 43 of the substrate 40 in the third direction Z along the chamfer portion 49 and the side surface 45 of the substrate 40 extending in the third direction Z, although its direction of extension is not limited thereto. For example, the side wiring 46 may extend to the rear surface 43 of the substrate 40 in the second direction Y along the chamfer portion 49 and the side surface 45 of the substrate 40 extending in the second direction Y.

According to an embodiment, the side wiring 46 may extend along edges E of the substrate 40, corresponding to an upper edge 32 and a lower edge 34 of the first display module 30A, although not limited thereto.

For example, the side wiring 46 may extend along edges E of the substrate 40, corresponding to at least two edges of the four edges 31, 32, 33, and 34 of the first display module 30A.

The upper wiring layer may be connected with the side wiring 46 by a front connecting pad formed on the edges E of the mounting surface 41.

The side wiring 46 may extend along the side surface 45 of the substrate 40 and be connected with a rear wiring layer 43b formed on the rear surface 43.

An insulating layer 43c may be formed on the rear wiring layer 43b in a direction which the rear surface 43 of the substrate 40 faces, to cover the rear wiring layer 43b.

That is, the plurality of inorganic light-emitting diodes 50 may be electrically connected with the upper wiring layer, the side wiring 46, and the rear wiring layer 43b, sequentially.

Also, as shown in FIG. 4, the first display module 30A may include a driving circuit board 80 for electrically controlling the plurality of inorganic light-emitting diodes 50 mounted on the mounting surface 41. The driving circuit board 80 may be a printed circuit board. The driving circuit board 80 may be positioned on the rear surface 43 of the substrate 40 in the first direction X. The driving circuit board 80 may be positioned on the metal plate 60 bonded on the rear surface 43 of the substrate 40.

The first display module 30A may include a flexible film 81 connecting the driving circuit board 80 with the rear wiring layer 43b to electrically connect the driving circuit board 80 with the plurality of inorganic light-emitting diodes 50.

More specifically, one end of the flexible film 81 may be connected with a rear connecting pad 43d positioned on the rear surface 43 of the substrate 40 and electrically connected with the plurality of inorganic light-emitting diodes 50.

The rear connecting pad 43d may be electrically connected with the rear wiring layer 43b. Accordingly, the rear connecting pad 43d may electrically connect the rear wiring layer 43b with the flexible film 81.

Because the flexible film 81 is electrically connected with the rear connecting pad 43d, the flexible film 81 may transfer power and an electrical signal from the driving circuit board 80 to the plurality of inorganic light-emitting diodes 50. The flexible film 81 may be a flexible flat cable (FFC) or a chip on film (COF). The flexible film 81 may include a first flexible film 81a and a second flexible film 81b respectively positioned in the upper and lower directions with respect to the first direction X which is the front direction, although not limited thereto. For example, the first and second flexible films 81a and 81b may be positioned in the left and right directions with respect to the first direction X, or in at least two directions of the up, down, left, and right directions with respect to the first direction X.

A plurality of second flexible films 81b may be provided, although not limited thereto. However, a single second flexible film 81b may be provided, and a plurality of first flexible films 81a may also be provided.

The first flexible film 81a may transfer a data signal from the driving circuit board 80 to the substrate 40. The first flexible film 81a may be a COF.

The second flexible film 81b may transfer power from the driving circuit board 80 to the substrate 40. The second flexible film 81b may be a FFC.

For example, the first flexible film 81a and the second flexible film 81b may be a FFC and a COF, respectively.

The driving circuit board 80 may be electrically connected with the main board 25 (see FIG. 2), although not shown in the drawings. The main board 25 may be positioned behind the frame 15, and the main board 25 may be connected with the driving circuit board 80 through a cable behind the frame 15.

A fixing member 82 for bonding the display modules 30A to 30P to the frame 15 may be positioned on a rear surface of the metal plate 60. The fixing member 82 may be, for example, a double-sided tape. The metal plate 60 forming a rear side of each of the display modules 30A to 30P may be bonded directly to the frame 15 by the fixing member 82, and accordingly, the display modules 30A to 30P may be supported by the frame 15.

As described above, the metal plate 60 may be in contact with the substrate 40. The metal plate 60 may be bonded with the substrate 40 by the rear adhesive tape 61 positioned between the rear surface 43 of the substrate 40 and the metal plate 60.

FIG. 5 shows the substrate 40 with selected components. Some components my not be illustrated in FIG. 5, for convenience of description. For example, the anisotropic conductive layer 47 is excluded, for convenience of description. Also, although the side wiring 46 includes the coating member 46a for protecting the side wiring 46 from outside, the coating member 46a is omitted for convenience of description.

The metal plate 60 may be formed of a metal material having high thermal conductivity. For example, the metal plate 60 may be formed of an aluminum material.

Heat generated by the TFT layer 44 and the plurality of inorganic light-emitting diodes 50 mounted on the substrate 40 may be transferred to the metal plate 60 through the rear adhesive tape 61 along the rear surface 43 of the substrate 40.

Accordingly, heat generated by the substrate 40 may be easily transferred to the metal plate 60, and temperature of the substrate 40 may be prevented from rising to certain temperature or higher.

The plurality of display modules 30A to 30P may be arranged at various locations in a M*N matrix form. The display modules 30A to 30P may be independently movable. In this case, because each of the display modules 30A to 30P includes the metal plate 60, a constant level of heat dissipation performance may be maintained regardless of the locations of the display modules 30A to 30P.

The display apparatus 1 may form screens having various sizes by arranging the display modules 30A to 30P in various forms of M*N matrixes. Therefore, by including the metal plate 60 in each of the display modules 30A to 30P to cause each of the display modules 30A to 30P to dissipate heat independently, according to an embodiment, instead of dissipating heat through a single metal plate for temporary heat dissipation, total heat dissipation performance of the display apparatus 1 may be improved.

In a case in which a single metal plate is positioned inside the display apparatus 1, the metal plate may be not positioned at locations corresponding to some display modules with respect to a front-rear direction, while being positioned at locations where no display modules are positioned, which lowers heat dissipation efficiency of the display apparatus 1.

That is, by positioning the metal plate 60 in each of the display modules 30A to 30P to cause each of the display modules 30A to 30P to dissipate heat at any location through the metal plate 60, the total heat dissipation performance of the display apparatus 1 may be improved.

The metal plate 60 may be provided in a shape of a rectangle substantially corresponding to a shape of the substrate 40.

An area of the substrate 40 may be at least equal to or larger than an area of the metal plate 60. Upon a parallel arrangement of the substrate 40 and the metal plate 60 in the first direction X, the four edges E of the substrate 40 being in the shape of the rectangle may correspond to four edges of the metal plate 60 with respect to a center of the substrate 40 and the metal plate 60, or the four edges E of the substrate 40 may be positioned at outer locations than the four edges of the metal plate 60 with respect to the center of the substrate 40 and the metal plate 60.

The four edges E of the substrate 40 may be positioned at more outward locations than the four edges of the metal plate 60. That is, the area of the substrate 40 may be larger than the area of the metal plate 60.

Upon transferring of heat to the display modules 30A to 30P, the substrate 40 and the metal plate 60 may be heat-expanded. Because the metal plate 60 has a greater coefficient of thermal expansion than the substrate 40, a degree of expansion of the metal plate 60 may be greater than a degree of expansion of the substrate 40.

In a case in which the four edges E of the substrate 40 correspond to the four edges of the metal plate 60 or are positioned at inner locations than the four edges of the metal plate 60, the edges of the metal plate 60 may protrude to outside of the substrate 40.

Accordingly, separation distances of gaps formed between the display modules 30A to 30P may become irregular due to heat-expansion of the metal plate 60 of each of the display modules 30A to 30P, and visibility of some seams may rise, which may result in a deterioration of a performance of a screen of the display panel 20.

However, by positioning the four edges E of the substrate 40 at more outward locations than the four edges of the metal plate 60, the metal plate 60 may not protrude to the outside of the four edges E of the substrate 40 even if the substrate 40 and the metal plate 60 are heat-expanded. Accordingly, the gaps formed between the display modules 30A to 30P may be maintained with regular separation distances.

In addition, to maintain constant separation distances of gaps formed between the display modules 30A to 30P, the frame 15 supporting the display modules 30A to 30P may include a front surface having a similar material property to that of the substrate 40. That is, the display modules 30A to 30P may be bonded on the front surface of the frame 15.

According to an embodiment, the area of the substrate 40 may substantially correspond to the area of the metal plate 60. Accordingly, heat generated from the substrate 40 may be uniformly dissipated over the entire area of the substrate 40 without being isolated in some areas.

The metal plate 60 may be bonded on the rear surface 43 of the substrate 40 by the rear adhesive tape 61.

The rear adhesive tape 61 may have a size corresponding to the metal plate 60. That is, an area of the rear adhesive tape 61 may correspond to the area of the metal plate 60. The metal plate 60 may be substantially in a shape of a rectangle, and the rear adhesive tape 61 may also be in a shape of a rectangle correspondingly.

The edges of the metal plate 60 being in the shape of the rectangle may correspond to the edges of the rear adhesive tape 61 being in the shape of the rectangle with respect to a center of the metal plate 60 and the rear adhesive tape 61.

Accordingly, the metal plate 60 and the rear adhesive tape 61 may be easily manufactured as a coupled configuration, thereby increasing manufacturing efficiency of the display apparatus 1.

That is, before a plate is cut into unit pieces to form the metal plate 60, the rear adhesive tape 61 may be bonded on the plate and then the rear adhesive tape 61 and the plate may be cut together into unit pieces to form the metal plate 60, thereby reducing a number of processes.

Heat generated from the substrate 40 may be transferred to the metal plate 60 through the rear adhesive tape 61. Accordingly, the rear adhesive tape 61 may bond the metal plate 60 on the substrate 40, while transferring heat generated from the substrate 40 to the metal plate 60.

Accordingly, the rear adhesive tape 61 may include a material having high heat dissipation performance.

The rear adhesive tape 61 may include, basically, a material having an adhesive property to bond the substrate 40 with the metal plate 60.

Additionally, the rear adhesive tape 61 may include a material having high heat dissipation performance rather than materials having an adhesive property. Accordingly, the rear adhesive tape 61 may efficiently transfer heat between the substrate 40 and the metal plate 60.

Also, the material having the adhesive property, included in the rear adhesive tape 61, may be a material having higher heat dissipation performance than adhesive materials constituting existing adhesives.

The material having the higher heat dissipation performance may be a material capable of effectively transferring heat because the material has high heat conductivity, high heat transfer performance, and low specific heat.

For example, the rear adhesive tape 61 may include a graphite material, although not limited thereto. However, the rear adhesive tape 61 may be formed of any material having high heat dissipation performance.

Flexibility of the rear adhesive tape 61 may be greater than flexibility of the substrate 40 and the metal plate 60. Accordingly, the rear adhesive tape 61 may be formed of a material having an adhesive property, heat dissipation, and high flexibility. The rear adhesive tape 61 may be a baseless double-sided tape. In this case, the rear adhesive tape 61 may be formed as a single layer of which one side is bonded on the substrate 40 and the other side is bonded on the metal plate 60, without having any base supporting the one side and the other side.

Because the rear adhesive tape 61 may include no base, the rear adhesive tape 61 may include no material interfering with heat conduction, and accordingly, heat dissipation performance may increase. However, the rear adhesive tape 61 is not limited to a baseless double-sided tape, and in some embodiments may be a heat dissipation tape having higher heat dissipation performance than existing double-sided tapes.

The rear adhesive tape 61 may be formed of a material having high flexibility to absorb an external force transferred from the substrate 40 and the metal plate 60. More specifically, flexibility of the rear adhesive tape 61 may be higher than flexibility of the substrate 40 and the metal plate 60.

Accordingly, upon transferring of an external force generated by changed sizes of the substrate 40 and the metal plate 60 by heat transferred to the substrate 40 and the metal plate 60 to the rear adhesive tape 61, the rear adhesive tape 61 may be deformed to prevent the external force from being transferred to the other components.

The rear adhesive tape 61 may have a certain thickness in the first direction X. The metal plate 60 may be heat-expanded by heat or cooled to be contracted. In this case, the metal plate 60 may be expanded or contracted in the first direction X and directions that are orthogonal to the first direction X, and accordingly, an external force may be transferred to the substrate 40.

As described above, because the metal plate 60 is formed with a size corresponding to the substrate 40 and covers the entire of the rear surface 43 of the substrate 40, a fixing member 82 may be positioned on a rear surface of the metal plate 60, although embodiments are not limited thereto. For example, the fixing member 82 may be positioned on the rear surface 43 of the substrate 40. In this case, the substrate 40 may be bonded directly on the frame 15 through the fixing member 82.

In other embodiments, the metal plate 60 may cover only a portion of the rear surface 43 of the substrate 40, and the fixing member 82 may be bonded on an area not covered by the metal plate 60 in the rear surface 43 of the substrate 40.

The fixing member 82 may be a double-sided tape.

Hereinafter, the front cover 70, a side cover 90, and a side end member 100 will be described in detail.

Figure 8:
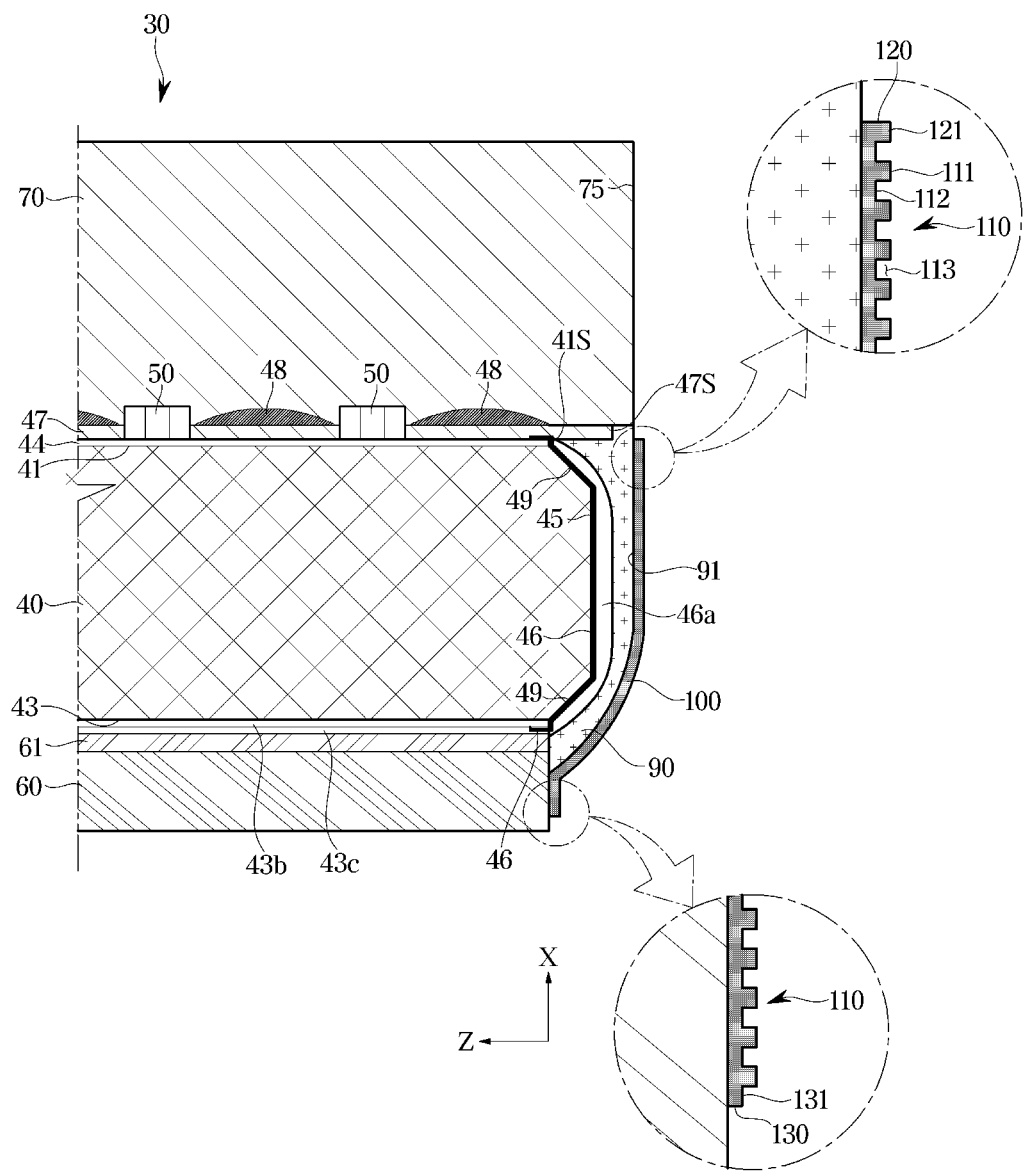
FIG. 8 is a cross-sectional view showing a portion of the display module of the display apparatus of FIG. 1, taken along a third direction.
Figure 9:
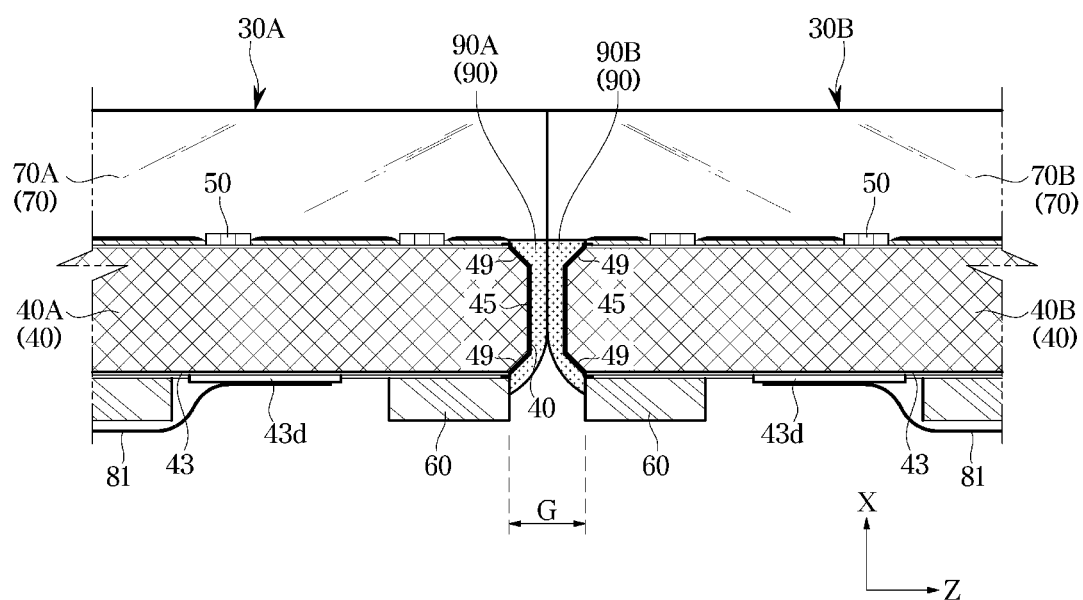
FIG. 9 is a cross-sectional view showing some components of the display apparatus of FIG. 1, taken along the third direction.
Figure 10:
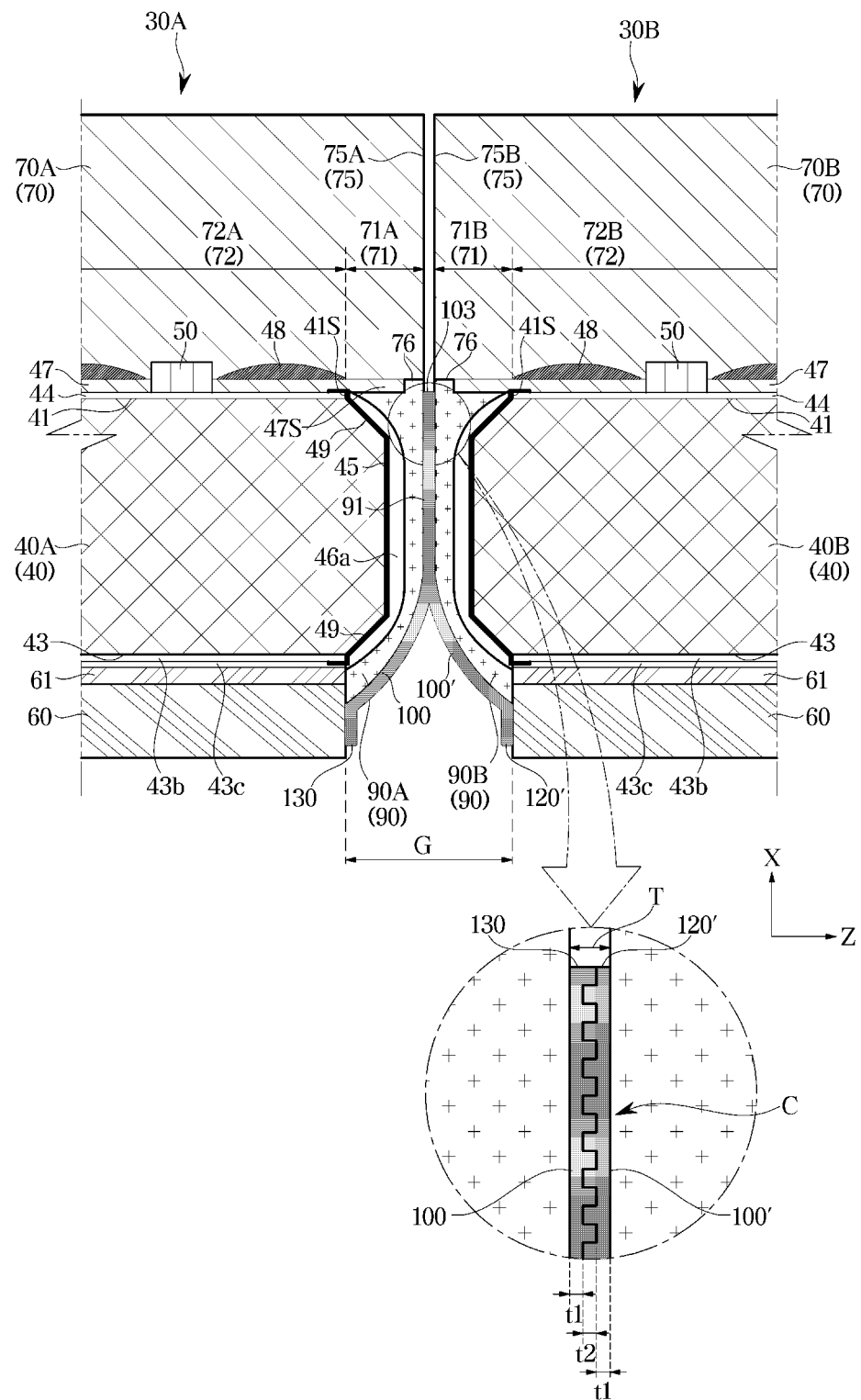
FIG. 10 is an enlarged cross-sectional view showing the some components of FIG. 9.

FIG. 6 is a cross-sectional view of some components of the display apparatus shown in FIG. 1, taken along a second direction, FIG. 7 is an enlarged cross-sectional view of the some components shown in FIG. 6, FIG. 8 is a cross-sectional view showing a portion of the display module of the display apparatus of FIG. 1, taken along a third direction, FIG. 9 is a cross-sectional view showing some components of the display apparatus of FIG. 1, taken along the third direction, and FIG. 10 is an enlarged cross-sectional view showing the some components of FIG. 9.

The front cover 70 may protect the substrate 40 from an external force, reduce the visibility of a seam caused by a gap G formed between the plurality of display modules 30A to 30P, and improve color deviation between the plurality of display modules 30A to 30P.

The plurality of display modules 30A to 30P may include the side cover 90 positioned in the gap G formed between the plurality of display modules 30A to 30P upon arraying of the plurality of display modules 30A to 30P.

To absorb light reflected in the gap G between the plurality of display modules 30A to 30P, the front cover 70 of each of the display modules 30A to 30P may extend to the outside of the substrate 40 of the display module 30A to 30P. A side end 75 of the front cover 70 may extend up to the outside of the mounting surface 41.

More specifically, the front cover 70 may extend up to an outer location than an edge (or referred to as a side end) 41S of the mounting surface 41 of the substrate 40 in the second direction Y and the third direction Z.

A gap G between the display modules 30A to 30P may be formed between the side surfaces 45 of the substrates 40 of the display modules 30A to 30P. The gap G according to an embodiment may represent a non-display area that may be generated between the display modules 30A to 30P, and therefore, the gap G formed between the plurality of display modules 30A to 30P may be a space formed between the edges 41S of the mounting surfaces 41 of the substrates 40 of neighboring ones of the display modules 30A to 30P.

Accordingly, the gap G formed between the plurality of display modules 30A to 30P may represent a space formed between the edges 41S of the mounting surfaces 41 of the display modules 30A to 30P being adjacent to each other in the second direction Y or the third direction Z.

The front cover 70 extending from the display modules 30A to 30P may be positioned in the gap G between the display modules 30A to 30P to absorb light irradiated toward the gap G or light reflected in the gap G, thereby reducing visibility of a seam.

Also, the side cover 90 of the display modules 30A to 30P, positioned in the gap G, may absorb light irradiated toward the gap G, thereby reducing visibility of a seam, which will be described below.

As shown in FIGS. 6 and 7, the front cover 70 may extend to the outside of the substrate 40 in the second direction Y. More specifically, the front cover 70 may extend up to an outer location than the side surface 45 and the chamfer portion 49 in the second direction Y.

According to an embodiment, a description about only an edge of the substrate 40 corresponding to the right edge 31 of the first display module 30A will be given, however, the front cover 70 may extend up to outer locations than the four edges E of the substrate 40 in the second direction Y or the third direction Z.

The side end 75 of the front cover 70, corresponding to an edge of the front cover 70, may extend up to the outside of the substrate 40 farther than the four edges E of the substrate 40, that is, up to the outside of the mounting surface 41, in the second direction Y or the third direction Z.

The front cover 70 may include a plurality of layers having different optical properties. The plurality of layers may have a structure resulting from stacking layers in the first direction X.

The plurality of layers may constitute the front cover 70 by being bonded in the first direction X.

In an embodiment, one of the plurality of layers may be an anti-glare layer, for example. As other examples, one of the plurality of layers may be an anti-reflective layer or a layer formed by combining an anti-glare layer with an anti-reflective layer.

In an embodiment, another one of the plurality of layers may be a light transmittance adjustable layer. In an example embodiment, the layer may be a layer having another physical property or including another material, or a layer having another function. For example, the layer may be a circularly polarized layer. Other layers or combinations of layers may also be part of the plurality of layers In an embodiment, the front cover 70 may include a single layer, instead of the plurality of layers. The single layer may be a layer capable of implementing all functions of the plurality of layers, similar functions or some subset of functions of the plurality of layers.

As described above, the front cover 70 may include an adhesive layer. The adhesive layer may be positioned at a hindmost location of the plurality of layers in the first direction X and bonded on the mounting surface 41. The adhesive layer may have a height that is greater than or equal to a preset height in the first direction X in which the mounting surface 41 or the light-emitting surface 54 faces. Having an adhesive layer of this height may allow the adhesive layer bonded on the substrate 40 to sufficiently fill a gap that may be formed between the adhesive layer and the plurality of inorganic light-emitting diodes 50.

However, the adhesive layer is not limited to this embodiment. For example, in another embodiment, the adhesive layer may be positioned as a separate component from the front cover 70 between the front cover 70 and the mounting surface 41 to bond the front cover 70 with the mounting surface 41.

Accordingly, because the front cover 70 is bonded with the mounting surface 41 in such a way as to be in close contact with the mounting surface 41 and protects components mounted on the mounting surface 41, the front cover 70 may be bonded directly to the substrate 40 without any additional molding component formed between the front cover 70 and the substrate 40.

The front cover 70 may diffuse and reflect light received from the outside to prevent the light from being specularly reflected, which may be unpleasing to a user.

By diffusing and reflecting light received from the outside, a glaring phenomenon may be reduced, and accordingly, contrast of a screen displayed on the display panel 20 may be improved.

Also, the front cover 70 may reduce transmittance of incident external light or external light reflected from the substrate 40 and the gap G.

The front cover 70 according to an embodiment may include a material capable of reducing transmittance of light, to absorb at least one part of light transmitted toward the substrate 40 or light reflected from the substrate 40 and then traveling toward the first direction X.

Some of a plurality of substrates may be manufactured with different colors due to processing. Accordingly, substrates having different unique colors may be tiled to constitute a single display panel.

As described above, the front cover 70 according to an embodiment may absorb at least one part of light reflected from the substrate 40 and transmitted to the outside, thereby raising a sense of unity of a screen displayed on the display panel 20.

That is, according to embodiments, the front cover 70 may reduce color deviation of the display modules 30A to 30P generated during processes of the plurality of display modules 30A to 30P by lowering transmittance with respect to external light.

The front cover 70 may prevent external light that enters the display panel 20 from the outside from being transmitted to the substrate 40, and additionally absorb a part of light entered the display panel 20 from the outside or a part of external light reflected from the substrate 40 and then transmitted to the outside of the display panel 20, thereby improving contrast of a screen that is displayed on the display panel 20. Such different optical actions may be respectively implemented by the plurality of layers described above.

That is, the front cover 70 may be positioned in front of the substrate 40 in the first direction X to improve contrast that may deteriorate by external light in a screen displayed on the display panel 20.

As described above, in the display module 30 according to an embodiment, the front cover 70 may extend up to the outside of the substrate 40 in the second direction Y.

Accordingly, a part of light entered the gap G formed between the plurality of display modules 30A to 30P may be blocked by at least one portion of the front cover 70 positioned in the gap G, and at least a part of external light entered the gap G or reflected in the gap G may be absorbed by the front cover 70 positioned in the gap G and thus will not be transmitted to the outside. Accordingly, visibility of a seam that is formed in the gap G may be lessened, and due to the lessening visibility of the seam, there may be an improvement in a sense unity of a screen that is displayed on the display panel 20.

More specifically, the side end 75 of the front cover 70 in the second direction Y may be positioned at a more outward location than the edge 41S of the mounting surface 41 in the second direction Y, or above the gap G.

Accordingly, the front cover 70 may include a first area 71 positioned at a location more outward than the edge 41S of the mounting surface 41 in the second direction Y or above the gap G, and a second area 72 positioned above the mounting surface 41.

The first area 71 and the second area 72 of the front cover 70 may be partitioned by the gap G in the second direction Y.

Because the first area 71 of the front cover 70 is positioned above the gap G, external light irradiated toward the gap G may be blocked by the first area 71 of the front cover 70 or light reflected in the gap G may be prevented from being irradiated to the outside. Accordingly, visibility of a seam which is a boundary between the plurality of display modules 30A to 30P and which may be formed by the gap G may be reduced, resulting in an improvement of a sense of unity of the display panel 20.

Because the front cover 70 extends to more outward locations than the four edges 41S of the mounting surface 41 of the substrate 40, as described above, visibility of seams that may be formed at the edges of the plurality of display modules 30A to 30P may be reduced.

In an example embodiment of the first display module 30A and the second display module 30E, a first area 71A of the first front cover 70A extending from the first display module 30A may be positioned in a gap G formed between the first display module 30A and the second display module 30E.

Above the gap G, neighboring side ends 75A and 75E of the first and second front covers 70A and 70E of the first and second display modules 30A and 30E may be positioned.

Also, in the gap G, the side surfaces 45 and chamfer portions 49 of the first and second display modules 30A and 30E may be positioned.

A second area 72A of the first front cover 70A may be positioned above the mounting surface 41 of the first display module 30A.

A first area 71E of the second front cover 70E, extending from the second display module 30E, may be positioned above the gap G formed between the first display module 30A and the second display module 30E, and a second area 72E of the second front cover 70E may be positioned above the mounting surface 41 of the second display module 30E.

That is, in the gap G formed between the first display module 30A and the second display module 30E, the first areas 71A and 71E of the first and second front covers 70A and 70E may be positioned side by side in the second direction Y.

A length in the third direction Y of the first area 71A or 71E of the first or second front cover 70A or 70B may be substantially smaller than or equal to half of a length of the gap G.

Accordingly, a sum of the lengths of the first areas 71A and 71E of the first and second front covers 70A and 70E, arranged side by side in the second direction Y, may substantially correspond to or be smaller than the length of the gap G.

According to an embodiment, in the case in which the first areas 71A and 71E of the first and second front covers 70A and 70E are arranged side by side in the second direction Y, the side end 75A of the first front cover 70A may be spaced from the side end 75E of the second front cover 70E. Such spacing may be caused by the side end member 100 (which will be described below) positioned at the side ends of the display modules 30A to 30P.

In an embodiment, the spacing may be a very small value such that it is negligible. Accordingly, in the embodiment, the first display module 30A and the second display module 30E may be tiled without any substantial space between the first area 71A of the first front cover 70A and the first area 71E of the second cover 70E.

The first area 71A of the first front cover 70A and the first area 71E of the second front cover 70E may be positioned above the gap G between the first display module 30A and the second display module 30E, as described above.

External light that enters the display panel 20 may be diffused and reflected to the outside of the display panel 20 while being transmitted through the first areas 71A and 71E of the first and second front covers 70A and 70E, or a part of the external light may be absorbed in the first areas 71A and 71E. Accordingly, an amount of the external light arrived at the gap G may be reduced, which reduces visibility of a boundary between the first display module 30A and the second display module 30E, caused by the gap G.

Also, light reflected in the gap G and then traveling to the outside of the display panel 20 may be diffused and reflected to the outside of the display panel 20 while being transmitted through the first areas 71A and 71E of the first and second front covers 70A and 70E of the first and second display modules 30A and 30B, or a part of the light may be absorbed in the first areas 71A and 71E. Accordingly, an amount of light transmitted to the outside of the display panel 20 may be reduced, which reduces visibility of the boundary between the first display module 30A and the second display module 30E, caused by the gap G.

That is, by reducing an amount of external light entering the gap G formed between the plurality of display modules 30A to 30P while absorbing at least one part of the external light reflected in the gap G, a sense of unity of a screen displayed on the display panel 20 may be improved.

Additionally, although a substrate 40A of the first display module 30A and a substrate 40E of the second display module 30E have different colors, at least one part of external light reflected from the substrates 40A and 40E may be absorbed in the first and second front covers 70A and 70E. Accordingly, unique colors of the substrates 40A and 40E may be not recognized from the outside, which improves a sense of unity of a screen displayed on the display panel 20.

The display module 30A may include the side cover 90 positioned below the front cover 70 in the direction in which the mounting surface 41 faces and provided on the side surface 45 of the substrate 40.

More specifically, the side cover 90 may be positioned in a space defined by a lower surface 76 of the first area 71 of the front cover 70 in the first direction X, a lower surface of the anisotropic conductive layer 47, and the side surface 45 of the substrate 40 in the second direction Y.

Also, a side end 47S of the anisotropic conductive layer 47 of the display module 30 may be aligned with the side end 75 of the front cover 70 in the first direction X, which is not shown. In this case, the side cover 90 may be positioned in a space defined by the lower surface of the anisotropic conductive layer 47 in the first direction X and the side surface 45 of the substrate 40 in the second direction Y.

Also, the side end 47S of the anisotropic conductive layer 47 of the display module 30 may be aligned with the edge 41S of the mounting surface 41 in the first direction X. In an embodiment, the side cover 90 may be positioned in a space defined by the lower surface 76 of the first area 71 of the front cover 70 in the first direction X and the side surface 45 of the substrate 40 in the second direction Y.

The side cover 90 may be bonded with the lower surface 76 of the first area 71, the side surface 45, and at least one portion of the side wiring 46. The side cover 90 may be bonded with the entire of the lower surface 76 of the first area 71. Also, the side cover 90 may cover the entire area of the side surface 45.

The lower surface 76 of the first area 71, which may be at least one portion of the lower surface of the front cover 70, may be a rear surface of an adhesive layer formed as the hindmost layer of the front cover 70.

In an embodiment, the side cover 90 may cover all of a pair of chamfer portions 49 positioned in a front-rear direction of the side surface 45, in the first direction X.

In an embodiment, the side cover 90 may surround the entire of the chamber portion 49 formed between the mounting surface 41 and the side surface 45, as well as the side surface 45.

Because the side cover 90 of an embodiment surrounds the chamfer portion 49 formed between the mounting surface 41 and the side surface 45, the side cover 90 may fill the entire of a space that may be formed between the substrate 40 and the front cover 70.

Accordingly, the side cover 90 of the embodiment may prevent a foreign material or water from the outside from entering the space between the substrate 40 and the front cover 70.

Also, because the side cover 90 surrounds the chamfer portion 49 formed between the rear surface 43 and the side surface, the side cover 90 may fill the entire of a space that may be formed between the substrate 40 and the metal plate 60.

Accordingly, the side cover 90 may prevent a foreign material or water from the outside from entering the space between the substrate 40 and the metal plate 60.

The side cover 90 may be in contact with the lower surface 76 of the first area 71, the chamfer portion 49 of the substrate 40, and the side surface 45. Accordingly, the side cover 90 may support the lower surface 76 of the first area 71, the chamfer portion 49 of the substrate 40, and the side surface 45.

The substrate 40 may be bonded with the front cover 70 as described above, and the side cover 90 may reinforce adhesiveness between the front cover 70 and the substrate 40. Accordingly, the side cover 90 may prevent the front cover 70 from escaping from the substrate 40.

That is, the side cover 90 may increase reliability of the display module 30A.

Also, the substrate 40 may be bonded with the metal plate 60 by the rear adhesive tape 61, and the side cover 90 may reinforce adhesiveness between the substrate 40 and the metal plate 60. Accordingly, the side cover 90 may prevent the metal plate 90 from escaping from the substrate 40.

The side surface 45 of the substrate 40 may correspond to the four edges 41S of the mounting surface 41, as described above, and the first area 71 of the front cover 70 may extend to locations more outward than the four edges 41S of the mounting surface 41 in the second direction Y and the third direction Z in which the mounting surface 41 extends.

The side cover 90 may surround the lower surface 76 of the first area 71 and the side surface 45 corresponding to each of the four edges 41S of the mounting surface 41, along the four edges 41S of the mounting surface 41.

That is, the side cover 90 may seal all edges of a portion at which the substrate 40 is bonded with the front cover 70.

The side cover 45 may cover the lower surface 76 of the first area 71 and the side surface 45 in all directions that are orthogonal to the first direction X.

Accordingly, bonding between the front cover 70 and the substrate 40 may be improved, and the front cover 70 and the side surface 45 of the substrate 40 may be protected from an external force.

Also, outside water or a foreign material may be prevented from entering between the substrate 40 and the front cover 70, as described above. In addition, upon formation of a gap between the substrate 40 and the front cover 70 due to degradation of adhesion, outside water or a foreign material may be prevented from entering the gap.

The side cover 90 may surround all four edges E of the substrate 40 along the side surface 45 of the substrate 40 to seal between the substrate 40, the front cover 70, and the metal plate 60.

Accordingly, the side cover 90 may prevent a foreign material or water entered the substrate 40 in all directions from permeating into the substrate 40 and the front cover 70.

Because the hindmost layer of the front cover 70 in the first direction X is an adhesive layer, as described above, the lower surface 76 of the first area 71 may be a rear surface of the adhesive layer.

Accordingly, upon exposure of the lower surface 76 of the first area 71 to the outside, a foreign material floating in the outside may be adhered to the lower surface 76 of the first area 71.

Upon arraying of the plurality of display modules 30A to 30P in a state in which a foreign material is adhered to the lower surface 76 of the first area 71, visibility of a seam generated between the plurality of display modules 30A to 30P may be increased by the foreign material adhered to the lower surface 76 of the first area 71.

However, because the display module 30A according to an embodiment includes the side cover 90 and the side cover 90 covers the lower surface 76 of the first area 71, the display module 30A may prevent a foreign material from being adhered to the lower surface 76 of the first area 71.

Accordingly, visibility of a seam generated between the plurality of display modules 30A to 30P due to a foreign material adhered to the front cover 70 upon arraying of the plurality of display modules 30A to 30P may be reduced.

Also, current may flow to a plurality of electronic components mounted on the substrate 40 by an electrostatic discharge that occurs on the display modules 30A to 30P to damage the electronic components. The side cover 90 may seal the substrate 40 from the outside and thus block charges generated by an electrostatic discharge from entering the substrate 40, to prevent the electronic components from being damaged, which will be described later.

That is, because the substrate 40 is sealed by the front cover 70 and the side cover 90, charges generated by an electrostatic discharge may be prevented from passing through the front cover 70 and the side cover 90 and thus flowing to the substrate 40. Also, charges flowing on the front cover 70 and the side cover 90 may be guided to the metal plate 60 being in contact with the side cover 90, thereby providing a path for current generated by an electrostatic discharge. Accordingly, electrostatic discharge (ESD) internal pressure of the electronic components mounted on the substrate 40 may be improved.

As described above, the display module 30A may be positioned below the front cover 70 in the direction in which the mounting surface 41 faces. That is, the side cover 90 may be not positioned above the lower surface 76 in the first direction X.

A foremost surface of the side cover 90 in the first direction X may be in contact with the lower surface 76 of the first area 71, and may be not positioned before the lower surface 76 of the first area 71 in the first direction X. According to an embodiment, this may be done so that the side cover 90 is not on a traveling path of light emitted from the plurality of inorganic light-emitting diodes 50.

In a case in which at least one portion of the side cover 90 is positioned before the lower surface 76 or the front cover 70 in the first direction X, the at least one portion of the side cover 90 may be positioned on a traveling path of light traveling forward through the front cover 70.

That is, the side cover 90 may absorb or diffuse and reflect a part of traveling light to distort an area of an image displayed on the display panel 20.

However, because the side cover 90 according to an embodiment is positioned behind the front cover 70 in the first direction X, the side cover 90 may not limit the travel of light emitted from the plurality of light-emitting diodes 50, thereby improving image quality of the display panel 20.

The side end 75 of the front cover 70 in the second direction Y and a side end portion 91 of the side cover 90 in the second direction Y may be substantially aligned in the first direction X.

The reason may be because the front cover 70 and the side cover 90 are cut simultaneously in a process of manufacturing the display module 30A. Also, the side end member 100 may be bonded with the side end 75 of the front cover 70 and the side end portion 91 of the side cover 90, substantially aligned in the first direction X.

That is, a space that may be formed between the plurality of display modules 30A to 30P upon arraying of the plurality of display modules 30A to 30P may be reduced, and visibility of a seam that is caused by the space between the plurality of display modules 30A to 30P may be reduced.

The side cover 90 may include a light absorbing material. For example, the side cover 90 may be formed of an opaque or translucent material.

Also, the side cover 90 may include a photosensitive material. For example, the side cover 90 may be formed of a photosensitive OCR. The photosensitive material may change physical properties to show a dark color by receiving external light, such as ultraviolet (UV) light, having a wavelength that is different from a wavelength of visible light.

Accordingly, by irradiating UV light to the side cover 90 during a manufacturing process to color the side cover 90 with a dark color, the side cover 90 may be provided as a light absorbing member.

The side cover 90 may have a dark color. The side cover 90 may have a darker color than the front cover 70.

The side cover 90 may have a similar color to that of the black matrix 48.

In the embodiment, owing at least in part to the color of the side cover 90, at least a portion of light may be absorbed in the side cover 90 without being reflected, by the light absorbing member of the side cover 90.

The side cover 90 may be positioned in the gap G formed between the plurality of display modules 30A to 30P, together with the first area 71 of the front cover 70, upon arraying of the plurality of display modules 30A to 30P.

Accordingly, by absorbing light entered the gap G, an amount of light reflected and then emitted to the outside among the light entered the gap G may be reduced. Therefore, visibility of a seam formed by the gap G between the plurality of display modules 30A to 30P may be reduced.

In the example of the first display module 30A and the second display module 30E, the first side cover 90A of the first display module 30A and a second side cover 90E of the second display module 30E may be positioned in the gap G formed between the first display module 30A and the second display module 30E, together with the first area 71A of the first front cover 70A and the first area 71E of the second front cover 70E.

In the gap G, the side end portion 91A of the side cover 90A of the first display module 30A and the side end portion 91E of the side cover 90E of the second display module 30E may be positioned together with the neighboring side ends 75A and 75E of the first and second front covers 70A and 70E of the first and second display modules 30A and 30E.

The neighboring side ends 75A and 75E of the first and second front covers 70A and 70E of the first and second display modules 30A and 30E and the neighboring side end portions 91A and 91E of the side covers 90A and 90E of the first and second display modules 30A and 30E may be opposite to each other. The neighboring side ends 75A and 75E of the first and second front covers 70A and 70E of the first and second display modules 30A and 30E and the neighboring side end portions 91A and 91E of the side covers 90A and 90E of the first and second display modules 30A and 30E may be positioned in parallel to each other.

That is, in the gap G formed between the first display module 30A and the second display module 30E, the first areas 71A and 71E of the first and second front covers 70A and 70E and the side covers 90A and 90E of the first and second display modules 30A and 30E may be positioned side by side in the second direction Y.

A length in second direction Y of each of the side covers 90A and 90E of the first and second display modules 30A and 30E may be substantially smaller than or equal to half of the length of the gap G to correspond to each of the first areas 71A and 71E of the first and second front covers 70A and 70E.

In the gap G between the first display module 30A and the second display module 30E, the first area 71A of the first front cover 70A and the first area 71E of the second front cover 70E may be positioned, and the side covers 90A and 90E of the first and second display modules 30A and 30E may be positioned behind the first areas 71A and 71E in the first direction X.

External light entered the display panel 20 may be diffused and reflected to the outside of the display panel 20 by being transmitted through the first areas 71A and 71E of the first and second front covers 70A and 70E, or a part of the external light may be absorbed in the first areas 71A and 71E of the first and second front covers 70A and 70E. Accordingly, an amount of light arrived at the gap G may be reduced.

In addition, light arrived at the gap G may be absorbed in the side covers 90A and 90E of the first and second display modules 30A and 30E, positioned in the gap G, and accordingly, visibility of a boundary between the first display module 30A and the second display module 30E may be reduced.

That is, by reducing an amount of external light entering the gap G formed between the plurality of display modules 30A to 30P and additionally absorbing light arrived at the gap G, a sense of unity of a screen displayed on the display panel 20 may be improved.

In addition, light reflected from the side covers 90A and 90E of the first and second display modules 30A and 30E and then traveling to the outside of the display panel 20 without being absorbed in the side covers 90A and 90E may be diffused and reflected to the outside of the display panel 20 by being transmitted through the first areas 71A and 71E of the first and second front covers 70A and 70E, or a part of the light may be absorbed in the first areas 71A and 71E.

Accordingly, an amount of light transmitted to the outside of the display panel 20 may be reduced, and thus, visibility of the boundary between the first display module 30A and the second display module 30E, caused by the gap G, may be reduced.

Because the side cover 90 is positioned in the gap G formed between the plurality of display modules 30A to 30P upon arraying of the plurality of display modules 30A to 30P, as described above, the side cover 90 may absorb light arrived at the gap G to reduce visibility of a seam, caused by the gap G.

In the above-described example embodiment, the front cover 70 may diffuse and reflect, absorb, or circularly polarize a part of light entered the display panel 20, or change a reflection direction of the part of the light, thereby reducing an amount of light that arrives at the substrate 40, although the embodiment is not limited thereto.

In an embodiment, the front cover 70 may be formed of a transparent material to transmit light without any deformation. In this case, visibility of the boundary between the plurality of display modules 30A to 30P, caused by the gap G, may be reduced by the side cover 90 positioned between the plurality of display modules 30A to 30P.

Because the side cover 90 is formed of a light absorbing material, as described above, a part of light emitted from the plurality of inorganic light-emitting diodes 50 may be absorbed in the side cover 90 in a case in which at least one portion of the side cover 90 is positioned before the front cover 70 in the first direction X. Accordingly, a certain area of a screen displayed on the display panel 20 may appear dark.

However, because the side cover 90 according to an embodiment is positioned below the front cover 70 in the first direction X, more specifically, below the lower surface 76 of the first area 71, the side cover 90 may not absorb light emitted from the plurality of inorganic light-emitting diodes 50, and accordingly, an image displayed on the display panel 20 may have uniform brightness.

The anisotropic conductive layer 47 may be in a form of an anisotropic conductive film. The anisotropic conductive layer 47 may be adhered in a form of a film to the TFT layer 41.

Because the anisotropic conductive layer 47 is in the form of the film, an area of the anisotropic conductive layer 47 may be larger than an area of the substrate 40.

Accordingly, after the anisotropic conductive layer 47 is adhered to the TFT layer 44, a process of cutting the anisotropic conductive layer 47 to correspond the area of the anisotropic conductive layer 47 to the area of the substrate 40 may be performed.

The cutting process may be to cut the anisotropic conductive layer 47 through laser cutting, etc. to correspond the area of the anisotropic conductive layer 47 to the area of the substrate 40.

The anisotropic conductive layer 47 may have an area corresponding to an area of the mounting surface 41. In some instances, it may be challenging to form the anisotropic conductive layer 47 as an anisotropic conductive film, as described above, of which an area corresponds to the area of the mounting surface 41, and, upon bonding of the anisotropic conductive film having the area corresponding to the mounting surface 41 onto the mounting surface 41, the anisotropic conductive film may have a smaller cross-sectional area than the mounting surface 41 due to manufacturing tolerance of the anisotropic conductive film, which deteriorates reliability of the display module 30.

Accordingly, in some embodiments, an anisotropic conductive film having a larger area than the mounting surface 41 is bonded with the substrate 40 and then cutting the anisotropic conductive film to an area corresponding to the substrate 40, the anisotropic conductive layer 47 may be formed.

The side surface 45 of the substrate 40 may be positioned at an outer location than the mounting surface 41 by the chamfer portion 49. In this embodiment, the anisotropic conductive film may be cut based on the side surface 45 of the substrate 40 in the second direction Y, although the embodiment is not limited thereto.

Also, the anisotropic conductive film may be cut based on a side end of the coating member 46*a* forming a side end of the side wiring 46 in the third direction Z (see FIG. 10). The reason may be because the side surface 45 of the substrate 40, the chamfer portion 49, or the side wiring 46 may be damaged upon cutting of the anisotropic conductive layer based on the mounting surface 41.

However, the anisotropic conductive layer 47 may be formed by cutting the anisotropic conductive film together with the front cover 70. The side end 47S of the anisotropic conductive layer 47 may be aligned with the side end 75 of the front cover 70 in the first direction X.

In this case, the side end 47S of the anisotropic conductive layer 47 may be exposed to the outside, and thus may be damaged by static electricity. However, reliability against ESD may be secured by the side end member 100 which will be described below.

Accordingly, upon cutting of the anisotropic conductive film, the side end 47S of the anisotropic conductive layer 47 may be positioned at an outer location than the mounting surface 41. More specifically, the anisotropic conductive film may be cut based on the side surface 45 or the side end of the side wiring 46, as described above. The side end 47S of the anisotropic conductive layer 47 may be aligned with the side surface 45 or the side end of the side wiring 46 in the first direction X. Also, due to manufacturing tolerance or burr molded in the anisotropic conductive film upon cutting, the anisotropic conductive layer 47 may be positioned at an outer location than the side surface 45 or the side end 46S of the side wiring 46.

In an embodiment, to prevent breakage of the substrate 40, which may actually occur in a cutting process, a location at which the anisotropic conductive film is cut may be an outer location than the side surface 45 or the side end 46S of the side wiring 46.

Accordingly, the side end 47S of the anisotropic conductive layer 47 may be positioned outside the substrate 40. Particularly, the side end 47S of the anisotropic conductive layer 47 may be positioned at the outer location than the side cover 90.

The side cover 90 may cover both an outer side in third direction Z of the side surface 45 of the substrate 40 and an outer side in second direction Y of the side surface 45, as shown in FIGS. 7 to 10.

That is, the side cover 90 may surround all of the four edges E of the substrate 40, as described above.

Accordingly, the mounting surface 41 which is the front surface of the substrate 40 may be covered by the front cover 70, the rear surface 43 of the substrate 40 may be covered by the metal plate 60, and the side surface 45 and the chamfer portion 49 of the substrate 40 may be covered by the side cover 90.

The front cover 70 may be formed of a nonconductive material through which no charges are transmitted.

In an embodiment, the side cover 90 may be formed of a nonconductive material through which no charges are transmitted.

In an embodiment, because the front cover 70 and the side cover 90 are formed of a nonconductive material, a major portion of current applied to the front cover 70 or the side cover 90 may float on the front cover 70 and the side cover 90 without being transmitted through the front cover 70 and the side cover 90.

Also, the metal plate 60 may be formed of a material having a high capacitance, and function as a ground component. Accordingly, upon application of current to the metal plate 60, the metal plate 60 may be maintained at a constant potential, and the current applied to the metal plate 60 may be absorbed in the metal plate 60 without flowing to the substrate 40 through the metal plate 60.

Also, the entire of the side wiring 46 of the substrate 40 may be surrounded by the side cover 90, and accordingly, the side wiring 46 may be sealed without being exposed to the outside. Therefore, although an electrostatic discharge occurs at the side surface 45 of the substrate 40, no current may enter the side wiring 46 by the side cover 90.

In a process of manufacturing a display apparatus by implementing a display panel with display modules, a plurality of display modules may be tiled to form the display panel. In a process of forming the display panel with the display modules, current generated by an electrostatic discharge while the display modules are manufactured and delivered may enter the insides of the display modules to damage electronic components installed inside the display modules.

Particularly, during a process of manufacturing the display module 30, a defect may be generated, and in this case, the side wiring 46 extending along the side surface 45 of the substrate 40 may be exposed to the outside, or a space may be made between the anisotropic conductive layer 47 and the front cover 70 or the substrate 40, and an inside space may be made in a process of applying and hardening the side cover 90. In this case, according to an electrostatic discharge, current may enter electronic components, such as the side wiring 46, etc., mounted on the substrate 40, due to the defect, to damage the electronic components.

To prevent current generated by an electrostatic discharge from entering the display module 30 to damage electronic components installed inside the display module 30 in a process before the display module 30 is coupled with the frame 15 to be assembled into the display apparatus 1, the display module 30 may include the front cover 70, the side cover 90, and the metal plate 60 to absorb an electrical impact.

Accordingly, each of the display modules 30A to 30P may independently include a component for blocking current generated by an electrostatic discharge from entering components mounted on the substrate 40, and the current generated by the electrostatic discharge may be easily guided to the metal plate 60 which is a ground component along the front cover 70 and the side cover 90 sealing the substrate 40 on each of the display modules 30A to 30P without entering the components mounted on the substrate 40.

The display apparatus 1 according to an embodiment may further include the side end member 100 positioned on an outer side end of the side cover 90 in the second direction Y and the third direction Z of the display module 30 and formed of a material having higher conductivity than the side cover 90.

The side end member 100 may easily guide static electricity to the metal plate 60 although the display modules 30A to 30P are insufficiently sealed due to a defect caused during a manufacturing process.

The side end member 100 may cover the outer side in second direction Y and third direction Z of the side surface 45 of the substrate 40, as shown in FIGS. 7 to 10. That is, the side end member 100 may surround all of the four edges of the substrate 40, although not limited thereto.

However, the side end member 100 may be formed only on the side surface 45 on which the side wiring 46 is formed. That is, according to an embodiment, the side end member 100 may be positioned only on the side surfaces 45 corresponding to the upper edge 32 and the lower edge 34 on which the side wring 46 is formed.

The side end member 100 may be formed of a metal material having higher conductivity than the side cover 90. The side end member 100 may be coated on the side cover 90 and positioned on the outer side end of the side cover 90.

Accordingly, the side end member 100 may be positioned in the gap G formed between the display modules 30A to 30P upon arraying of the display modules 30A to 30P.

One end of the side end member 100 may be in contact with the metal plate 60, and the other end of the side end member 100 may be positioned on the side end portion 91 of the side cover 90. That is, the side end member 100 may cover at least one of the side cover 90 and at least one portion of the metal plate 60 in the second direction Y and the third direction Z.

The side end member 100 may be in a form of a thin film. The reason may be because the side end member 100 is positioned in the gap G formed between the display modules 30A to 30P upon tiling of the display modules 30A to 30P. A great thickness of the side end member 100 may require a great gap G between the display modules 30A to 30P, which may cause visibility of a seam between the display modules 30A to 30P.

A certain space may be generated between the neighboring display modules 30A to 30P by the side end member 100 although the side end member 100 is in the form of a thin film. To reduce the certain space between the neighboring display modules 30A to 30P, neighboring side end members 100 may overlap with each other in the second direction Y and the third direction Z, which will be described in detail below.

The side end member 100 may be formed of a material having high conductivity. For example, the side end member 100 may be formed of a material, such as a metal, a conductive polymer, a conductive fabric, etc., which is capable of being electrically grounded to the metal plate 60.

The side end member 100 may be formed of a material having higher conductivity than the side cover 90. Also, the side end member 100 may be formed of a material having higher conductivity than the front cover 70.

Accordingly, current generated by an electrostatic discharge E1 on the front cover 70 or the side cover 90 may not enter the substrate 40 because the current is not transmitted through the front cover 70 or the side cover 90, and the current may float on the front cover 70 to enter the side end member 100.

The current entered the side end member 100 may enter the metal plate 60 through the side end member 100. The reason may be because the side end member 100 is in contact with the metal plate 60 and grounded to the ground component.

That is, the side end member 100 may provide a current path for causing current generated by an electrostatic discharge occurred on the front cover 70 or the side cover 90 to flow to the metal plate 60 provided as the ground component. The side end member 100 may guide charges generated by an electrostatic discharge to the ground.

Accordingly, because a major part of current generated by an electrostatic discharge on the front cover 70 or the side cover 90 flows to the metal plate 60 through the side end member 100 having high conductivity, ESD internal pressure of the electronic components mounted on the substrate 40 may be improved, although some current flows to the substrate 40.

In addition, electrostatic current transferred to the metal plate 60 may escape to an external ground through a component, such as a bridge board or a cable, being in contact with the metal plate 60.

The side end member 100 may have a dark color. The side end member 100 may have a black color. The side end member 100 may have a darker color than the front cover 70.

The side end member 100 may have a similar color to that of the black matrix 48 or the side cover 90. Accordingly, light entered the side end member 100 may be absorbed in the side end member 100 without being reflected.

As described above, each of the display modules 30A to 30P may independently include the front cover 70, the side cover 90, the metal plate 60, and the side end member 100 to prevent infiltration of current generated according to an electrostatic discharge.

Accordingly, after the front cover 70, the side cover 90, the metal plate 60, and the side end member 100 are installed in each of the display modules 30A to 30P, the display modules 30A to 30P may be protected from current generated according to an electrostatic discharge that may occur in the subsequent manufacturing process or a transfer process. Particularly, current generated by an electrostatic discharge may be easily guided to the metal plate 60 by the side end member 100 although the front cover 70 and the side cover 90 fail to completely seal the substrate 40 due to a defect caused during a manufacturing process, and accordingly, the display modules 30A to 30P may be protected from current generated by an electrostatic discharge.

Hereinafter, a shape of the side end member 100, capable of reducing a space that is generated between the neighboring display modules 30A to 30P by the side end member 100, will be described in detail. For convenience of description, the side end member 100 will be described with reference to the first display module 30A, though each of the display modules 30A to 30P of the example embodiment include a side end member 100 and/or side end member 100'.

As shown in FIG. 8, the side end member 100 may include a first end portion 120 and a second end portion 130 spaced from the first end portion 120 in the first direction X.

More specifically, the first end portion 120 may be positioned on the side end portion 91 of the side cover 90 such that the side end member 100 covers at least one portion of the side cover 90. The second end portion 130 may cover at least one portion of the metal plate 60 and be in contact with the metal plate 60 such that the side end member 100 is grounded to the metal plate 60. As shown, the first end portion 120 may be positioned before the second end portion 130 in the first direction X. That is, for example, the first end portion 120 may be relatively closer to the front cover 170 and the second end portion 130 relatively farther from the cover in the first direction X.

The first end portion 120 may be positioned behind the front cover 70 in the first direction X. The first end portion 120 may be positioned behind the light-emitting surface 54 of the plurality of inorganic light-emitting diodes 50 in the first direction X.

The reason may be because the first end portion 120 of the side end member 100 positioned in the gap G above the light-emitting surface 54 may be recognized as a seam that may be generated between the display modules 30A to 30P by light irradiated from the plurality of inorganic light-emitting diodes 50.

The side end member 100 may include a side end portion 110 extending from the first end portion 120 to the second end portion 130 and forming a side end of the side end member 100.

One surface of the side end member 100 may be in contact with the side cover 90 and the metal plate 60, and the other surface of the side end member 100 may be positioned outward in an extension direction of the mounting surface 41 and form the side end portion 110.

The side end portion 110 may include a plurality of mountains 111 and a plurality of valleys 112 that are alternately arranged in the first direction X.

The plurality of mountains 111 may be protrusions protruding in the second direction Y or the third direction Z, and the plurality of valleys 112 may be concave in the second direction Y or the third direction Z with respect to the plurality of mountains 111.

Because the plurality of mountains 111 and the plurality of valleys 112 are alternately arranged, the plurality of valleys 112 may form concave grooves 113.

A mountain 121 among the plurality of mountains 111 and the plurality of valleys 112 may be positioned at the first end portion 120. The mountain 121 positioned in the first end portion 120 is referred to as a first mountain 121.

A valley 131 among the plurality of mountains 111 and the plurality of valleys 112 may be positioned at the second end portion 130. The valley 131 positioned in the second end portion 130 is referred to as a first valley 131.

At a front end of the side end portion 110 in the first direction X, the first mountain 121 may be positioned and the plurality of mountains 111 and the plurality of valleys 112 may be alternately positioned starting from the first mountain 121. At a rear end of the side end portion 110, the first valley 131 may be positioned. The side end portion 110 may end at the first valley 131.

According to an embodiment, the separation distance T between the plurality of display modules 30A to 30P may be reduced by overlapping the side end members 100 of the display modules 30A to 30P with each other in the second direction Y or the third direction Z upon arraying of the display modules 30A to 30P.

For example, in the side end member 100 of the first display module 30A, the first end portion 120 may be positioned at the front end of the side end member 100 in the first direction X and the second end portion 130 may be positioned at the rear end of the side end member 110, as described above.

As shown in FIG. 7, the side end member 100 of the second display module 30E being adjacent to the first display module 30A in the second direction Y may be positioned in a state of being rotated to 180 degrees in the first direction X with respect to the side end member 100 of the first display module 30A. The side end members 100 of all display modules that are adjacent to the first display module 30A in the second direction Y and the third direction Z, such as the second display module 30E shown in FIG. 7 and the third display module 30B shown in FIG. 10, may be positioned in a state of being rotated to 180 degrees in the first direction X with respect to the side end member 100 of the first display module 30A.

That is, in the side end member 100 of the second display module 30E, the first end portion 120 may be positioned at a rear end of the side end member 100 in the first direction X, and the second end portion 130 may be positioned at a front end of the side end member 100 in the first direction X.

In the side end member 100 of the first display module 30A, the first end portion 120 is positioned at the front end of the side end member 100 in the first direction X and the second end portion 130 is positioned at the rear end of the side end member 100. Other display modules of the plurality of display modules 30A to 30P may include side member 100'. Side end member 100' should be assumed to include the same features as side end member 100 unless otherwise described and the description of features of side end member 100 are applicable to side end member 100'. In side end member 100', the first end portion 120 is positioned at the rear end of the side end member 100 in the first direction X and the second end portion 130 is positioned at the front end of the side end member 100 in the first direction X is defined as a side end member 100' of a second arrangement. The second display module 30E includes side end member 100' as shown in FIG. 7. As shown in the embodiment of FIG. 7, because the first display module 30A has the side end member 100 and the second display module 30E has the side end member 100', the first display module 30A and the second display module 30E may be engaged at the side end members 100 and 100'. In particular, the mountains 111 of the side end member 100 are positioned to be in inserted into the valleys 112 of the side end member 100'. Conversely, the mountings 111 of the side end member 100' inserted into the valleys 112 of the side end member 100 thereby engaging first display module 30A and second display module 30E through the respective side members 100, 100'.

In embodiments, any of the plurality of display modules 30A to 30P may have either or both of the side end members 100 and 100'. For example, in another example embodiment, instead of the first display module 30A including a side end module 100 and the second display module 30E including a side end module 100', they may be reversed such that the first display module 30A includes a side end module 100' and the second display module 30E includes a side end module 100.

Referring back to the example embodiment as shown in FIG. 7, the side end member 100' of the second display module 30E may be bonded with the side cover 90E and the metal plate 60 of the second display module 30E such that a first end portion 120' is in contact with the metal plate 60 and a second end portion 130' is positioned on the side end portion 91 of the side cover 90.

Because a mountain 121 is positioned in the first end portion 120' and a valley 131 is positioned in the second end portion 130', as described above, the side end portion 100' having the second arrangement may include the valley 131 at the front end in the first direction X.

Accordingly, the plurality of mountains 111 and the plurality of valleys 112 of the side end member 100 of the first display module 30A may be arranged alternately with the plurality of mountains 111 and the plurality of valleys 112 of the side end member 100' of the second display module 30E at the same height in the first direction X.

That is, in a case in which a mountain 111 is positioned in the side end member 100 of the first display module 30A at a certain height in the first direction X, a valley 112 may be positioned in the side end member 100' of the second display module 30E at the certain height in the first direction X. Inversely, in a case in which a valley 112 is positioned in the side end member 100 of the first display module 30A at a certain height in the first direction X, a mountain 111 may be positioned in the side end member 100' of the second display module 30E at the certain height in the first direction X.

Accordingly, upon arraying of the first display module 30A and the second display module 30E in the second direction Y, the side end member 100 of the first display module 30A may overlap with the side end member 100' of the second display module 30E in the second direction Y.

That is, the plurality of mountains 111 of the side end member 100 of the first display module 30A may be inserted into the grooves 113 formed by the plurality of valleys 112 of the side end member 100' of the second display module 30E.

Accordingly, at least one portion of the side end member 100 of the first display module 30A may overlap with at least one portion of the side end member 100' of the second display module 30E in the second direction Y to form a coupling section C, and a separation distance T between the first display module 30A and the second display module 30E may be reduced by a length of the overlapping portion of the coupling section C in the second direction Y.

A protrusion height of the plurality of mountains 111 of the side end member 100 may be equal to a depth of the plurality of valleys 112. The may be done so that the plurality of mountains 111 of the first display module 30A can be inserted into the corresponding plurality of valleys 112 of the second display module 30E. Similarly, the plurality of mountains 111 of the second display module 30E can be inserted into the corresponding plurality of valleys 112 of the first display module 30A and a constant maximum depth upon overlapping of the at least one portion of the side end member 100 of the first display module 30A with the at least one portion of the side end member 100' of the second display module 30E is maintained.

Also, a protrusion volume of each of the plurality of mountains 111 may be equal to a depression volume of each of the plurality of valleys 112. The may be done so that the plurality of mountains 111 of the first display module 30A can be inserted into the corresponding plurality of valleys of the second display module 30E. Similarly, the plurality of mountains 111 of the second display module 30E can be inserted into the corresponding plurality of valleys 112 of the first display module 30A while maintaining a constant maximum volume.

In the side end member 100, a base length of the side end member 100 is defined as t1, and a protrusion length of each of the plurality of mountains 111 in the second direction Y or the third direction Z is defined as t2. In this case, a separation distance T between the first display module 30A and the second display module 30E may be 2*t1+t2. In a case in which the side end portion 110 of the side end member 100 is not formed as the plurality of mountains 111 and the plurality of valleys 112, a separation distance T between the first display module 30A and the second display module 30E may be 2*t1+2*t2. Therefore, due to the side end portion 110 including the plurality of mountains 111 and the plurality of valleys 112, the separation distance T between the first display module 30A and the second display module 30E may be reduced by a length of t2, and accordingly, the separation distance T between the first display module 30A and the second display module 30E may be reduced. As shown in FIGS. 9 and 10, the front cover 70 may extend up to an outer location than the substrate 40 in the third direction Z. More specifically, the front cover 70 may extend up to an outer location than the side surface 45 and the chamfer portion 49 in the third direction Z.

The side end 75 of the front cover 70 in the third direction Z may be positioned at an outer location than the edge 41S of the mounting surface 41 in the third direction Z, or above the gap G.

The first area 71 and the second area 72 of the front cover 70 may also be partitioned by the gap G in the third direction Z.

In the example of the first display module 70 and the third display module 30B, the first area 71A of the first front cover 70A of the first display module 30A may be positioned in a gap G formed between the first display module 30A and the third display module 30B.

In the gap G, the neighboring side ends 75A and 75B of the first and third front covers 70A and 70B of the first and third display modules 30A and 30B may be positioned.

Also, in the gap G, the side surfaces 45 and chamfer portions 49 of the first and third display modules 30A to 30B may be positioned.

The first area 71B of the third front cover 70B of the third display module 30B may be positioned in the gap G formed between the first display module 30A and the third display module 30B, and a second area 72B of the third front cover 70B may be positioned above the mounting surface 41 of the third display module 30B.

That is, in the gap G formed between the first display module 30 and the third display module 30B, the first areas 71A and 71B of the first and third front covers 70A and 70B may be positioned side by side in the third direction Z.

External light entered the display panel 20 may be diffused and reflected to the outside of the display panel 20 while being transmitted through the first areas 71A and 71B of the first and third front covers 70A and 70B, or a part of the external light may be absorbed in the first areas 71A and 71B. Accordingly, an amount of the external light arrived at the gap G may be reduced, which reduces visibility of a boundary between the first display module 30A and the third display module 30B, caused by the gap G.

Also, light reflected in the gap G and then traveling to the outside of the display panel 20 may be diffused and reflected to the outside of the display panel 20 while being transmitted through the first areas 71A and 71B of the first and third front covers 70A and 70B, or a part of the light may be absorbed in the first areas 71A and 71B. Accordingly, an amount of light transmitted to the outside of the display panel 20 may be reduced, which reduces visibility of the boundary between the first display module 30A and the third display module 30B, caused by the gap G.

As described above, the side cover 90 may be positioned in a space formed on the side surface 45 of the substrate 40 in the third direction Z, as well as the second direction Y.

On the side surface 45 of the substrate 40, positioned toward the third direction Z, the side wiring 46 may be positioned. Accordingly, the side cover 90 provided on the side surface 45 positioned toward the third direction Z may surround the side wiring 46, as well as the side surface 45 and the chamfer portion 49. Accordingly, the side cover 90 may protect the side wiring 46 from an external force and prevent a foreign material or water from permeating into the side wiring 46.

That is, the side cover 90 may surround the lower surface 76 of the first area 71 and the side surface 45 corresponding to each of the four edges 41S of the mounting surface 41, along the four edges 41S of the mounting surface 41, and surround the side wiring 46 extending along the side surface 45 in the third direction Z.

Accordingly, bonding between the front cover 70 and the substrate 40 may be improved, and the front cover 70, the side surface 45 of the substrate 40, and the side wiring 46 may be protected from an external force.

The side end 75 in third direction Z of the front cover 70 may be aligned with the side end portion 91 in third direction Z of the side cover 90 in the first direction X. The side end 75 in third direction Z of the front cover 70 may be aligned with the side end portion 91 in third direction Z of the side cover 90 in a direction being parallel to the first direction X.

In the example of the first display module 30A and the second display module 30E, the first side cover 90A of the first display module 30A and the third side cover 90B of the third display module 30B may be positioned in the gap G formed between the first display module 30A and the third display module 30B, together with the first area 71A of the first front cover 70A and the first area 71B of the third front cover 70B.

In the gap G, the neighboring side end portions 91A and 91B of the side covers 90A and 90B may be positioned together with the neighboring side ends 75A and 75B of the front covers 70A and 70B of the first and third display modules 30A and 30B.

The neighboring side ends 75A and 75B of the front covers 70A and 70B and the neighboring side end portions 91A and 91B of the side covers 90A and 90B may be opposite to each other.

The neighboring side ends 75A and 75B of the front covers 70A and 70B and the neighboring side end portions 91A and 91B of the side covers 90A and 90B may be parallel to each other.

That is, in the gap G formed between the first display module 30A and the third display module 30B, the first areas 71A and 71B of the first and third front covers 70A and 70B and the first and third side covers 90A and 90B may be positioned side by side in the third direction Z.

In the gap G formed between the first display module 30A and the third display module 30B, the first areas 71A and 71B of the first and third front covers 70A and 70B and the first and third side covers 90A and 90 B may be positioned side by side in the third direction Z.

In the gap G formed between the first display module 30A and the third display module 30B, the first area 71A of the first front cover 70A and the first area 71B of the third front cover 70B may be positioned, and the first and third side covers 90A and 90B may be positioned behind the first areas 71A and 71B in the first direction X.

As described above, external light entered the display panel 20 may be diffused and reflected to the outside of the display panel 20 by being transmitted through the first areas 71A and 71B of the first and third front covers 70A and 70B, or a part of the external light may be absorbed in the first areas 71A and 71B of the first and third front covers 70A and 70B. Accordingly, an amount of light arrived at the gap G may be reduced.

In addition, light arrived at the gap G may be absorbed in the first and third side covers 90A and 90B positioned in the gap G, and accordingly, visibility of a boundary between the first display module 30A and the third display module 30B may be reduced.

light reflected from the first and third side covers 90A and 90B and then traveling to the outside of the display panel 20 without being absorbed in the first and third side covers 90A and 90B may be diffused and reflected to the outside of the display panel 20 by being transmitted through the first areas 71A and 71B of the first and third front covers 70A and 70B, or a part of the light may be absorbed in the first areas 71A and 71B. Accordingly, an amount of light transmitted to the outside of the display panel 20 may be reduced, and thus, visibility of the boundary between the first display module 30A and the second display module 30E, caused by the gap G, may be reduced.

The side cover 90 may be applied with a preset amount by a dispenser in a manufacturing process. The applied side cover 90 may be hardened by the subsequent operation. The side cover 90 may be formed of, for example, a nonconductive black resin.

The side cover 90 may be applied to cover all of the rear surface of the front cover 70, the side surface 45 of the substrate 40, the chamfer portion 49 formed between the mounting surface 41 and the side surface 45, and the chamfer portion 49 formed between the side surface 45 and the rear surface 43.

An operation of dispensing the side cover 90 may be performed on all of the four edges E of the substrate 40. Accordingly, the side cover 90 may be dispensed to cover all the side surfaces 45 of the substrate 40. Also, the entire of an area positioned outside the mounting surface 41 in the anisotropic conductive layer 47 may be covered by the side cover 90.

According to hardening of the side cover 90, the side cover 90 may be bonded with the rear surface of the front cover 70 with respect to the first direction X, the side surface 45 of the substrate 40, the chamfer portion 49 formed between the side surface 45 and the mounting surface 41, and the area positioned outside the mounting surface 41 in the anisotropic conductive layer 47.

The side cover 90 may include a photosensitive material. In this case, UV light, etc. may be irradiated to the side cover 90 in a subsequent operation to color the side cover 90 with a dark color. However, in a case in which the side cover 90 is formed of a translucent or opaque material without including a photosensitive material, the subsequent operation may be not needed.

As described above, in the gap G between the first display module 30A and the third display module 30B in the third direction Z, the side end members 100 and 100' of the first display module 30A and the third display module 30B may be positioned.

Upon arraying of the first display module 30A and the third display module 30B in the third direction Z, the side end members 100 and 100' of the first display module 30A and the third display module 30B may overlap with each other in the third direction Z to reduce a separation distance T between the first display module 30A and the third display module 30B.

As described above, the side end member 100' of the third display module 30B being adjacent to the first display module 30A may be positioned in a state of being rotated to 180 degrees in the first direction X with respect to the side end member 100 of the first display module 30A.

Accordingly, the plurality of mountains 111 and the plurality of valleys 112 of the side end member 100 of the first display module 30A may be arranged alternately with the plurality of mountains 111 and the plurality of valleys 112 of the side end member 100' of the third display module 30B at the same height in the first direction X.

Upon arraying of the first display module 30A and the third display module 30B in the third direction Z, the side end member 100 of the first display module 30A may overlap with the side end member 100' of the third display module 30B in the third direction Z.

That is, the plurality of mountains 111 of the side end member 100 of the first display module 30A may be inserted into the grooves 113 formed by the plurality of valleys 112 of the side end member 100' of the third display module 30B.

Accordingly, at least one portion of the side end member 100 of the first display module 30A may overlap with at least one portion of the side end member 100' of the third display module 30B in the third direction Z to form a coupling section C, and a separation distance T between the first display module 30A and the third display module 30B may be reduced by a length of the overlapping portion of the coupling section C in the third direction Z.

The side end members 100' of the second display module 30E and the third display module 30B being adjacent to the first display module 30A in the second direction Y and the third direction Z have been described above with reference to FIGS. 7 and 10. However, for example, a side end member 100 of the fourth display module 30I being opposite to the first display module 30A with respect to the second display module 30E may be positioned in a state of being rotated to 180 degrees in the first direction X with respect to the side end member 100' of the second display module 30E.

Accordingly, the side end member 100 of the fourth display module 30I may be positioned in the first arrangement, like the first display module 30A.

Also, a side end member 100 of the fifth display module 30C being opposite to the first display module 30A with respect to the third display module 30B may be positioned in a state of being rotated to 180 degrees in the first direction X with respect to the side end member 100' of the third display module 30B. Accordingly, the side end member 100 of the fifth display module 30C may be positioned in the first arrangement, like the first display module 30A.

That is, the side end members 100 and 100' of the neighboring display modules 30A to 30P may be intercrossed with a phase difference of 180 degrees. Accordingly, the side end members 100 and 100' of the neighboring display modules 30A to 30P may overlap with each other in the second direction Y or the third direction Z, and thus, a substantial separation distance T between the display modules 30A to 30P may be reduced.

Hereinafter, a side end member 200 according to another embodiment will be described. The side end member 200 which will be described below may have the same configuration as the side end member 100 described above except that the side end member 200 has a different shape for reducing a separation distance between the neighboring display modules 30A to 30P.

For convenience of description, a side end member 200 of a first display module 30A will be described, and a third display module 30B arrayed to be adjacent to the first display module 30A in the third direction Z will be described as an example.

Figure 11:
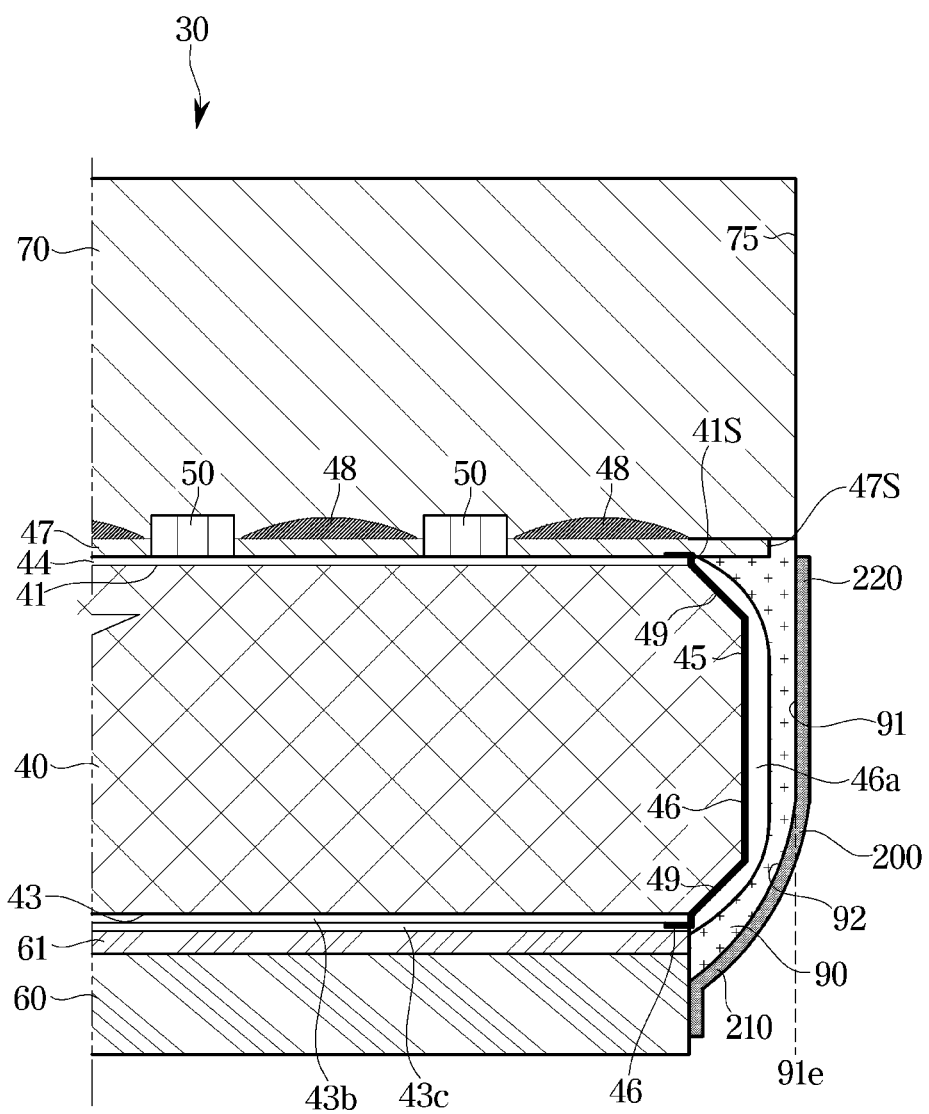
FIG. 11 is a cross-sectional view showing a portion of a display module of a display apparatus according to another embodiment of the disclosure, taken along the third direction.
Figure 12:
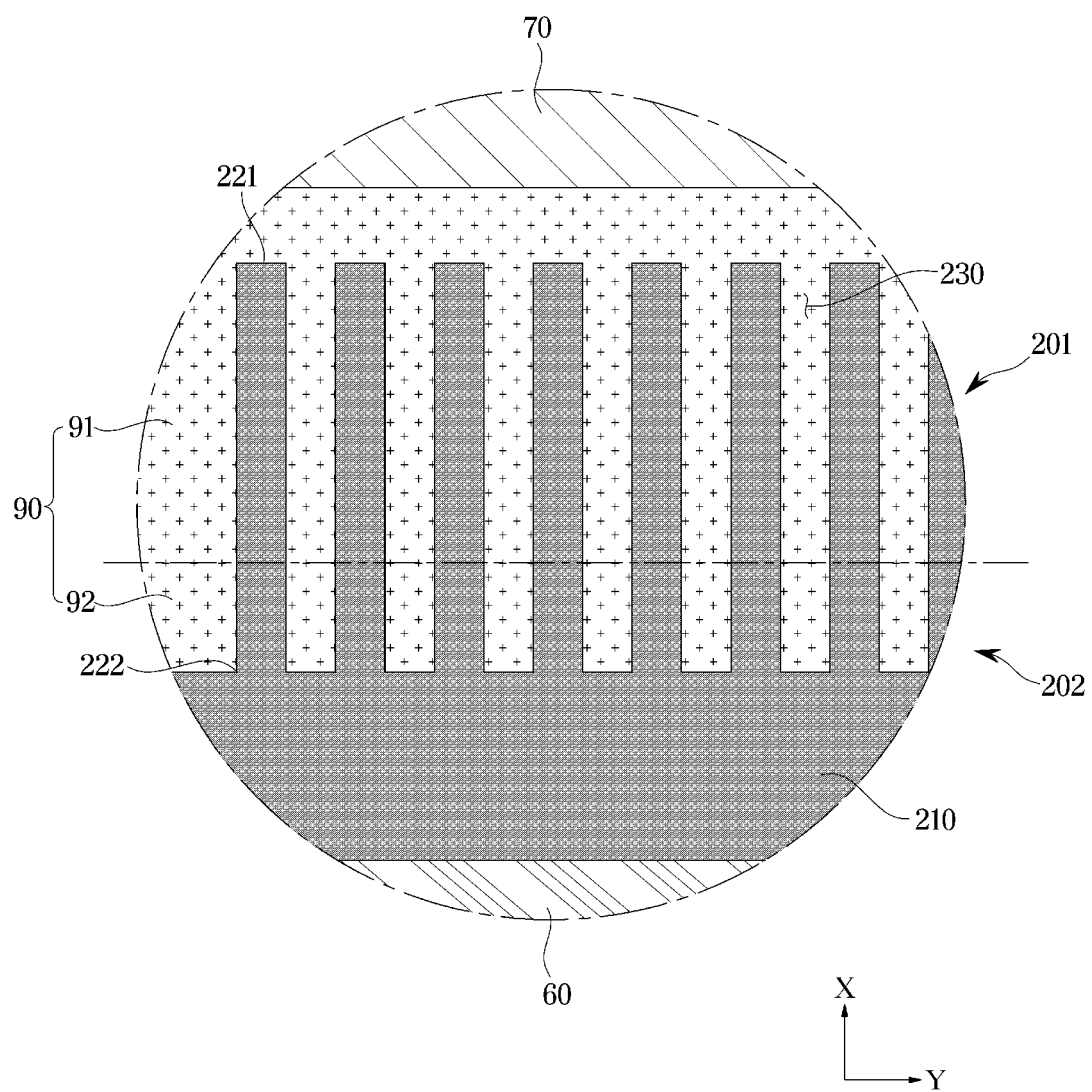
FIG. 12 is a side view showing some components of the display module of the display apparatus of FIG. 11, taken along the third direction.

FIG. 11 is a cross-sectional view showing a portion of a display module of a display apparatus according to another embodiment, taken along the third direction, and FIG. 12 is a side view showing some components of the display module of the display apparatus of FIG. 11, taken along the third direction.

As shown in FIGS. 11 and 12, the side end member 200 may cover at least one portion of the side cover 90 and extend along the second direction Y. In an example of the side end member 200 formed on the side surface 45 in the third direction Z, the side end portion 200 formed on the side surface 45 in the second direction Y may extend along the third direction Z.

The side end member 200 may include a body 210 extending in one direction along the second direction Y, and a plurality of ribs 220 extending in the first direction X from the body 210 and arranged at intervals along the second direction Y.

The body 210 may be formed at a rear portion of the side end member 200 in the first direction X, and the plurality of ribs 220 may extend from the body 210 toward the front direction X.

The side cover 90 may include a side end portion 91 forming a side end 91e of the side cover 90, and a rear portion 92 extending from a rear end of the side end portion 91 in the first direction X and positioned at an inner location than the side end portion 91 in the third direction Z.

In the side cover 90, the side end portion 91 may be formed in a front portion of the side cover 90 in the first direction X, and the rear portion 92 may be formed in a rear portion of the side cover 90 in the first direction X.

The rear portion 92 may cover a rear portion of the side surface 45 in the first direction X, and extend to an inner location in the third direction Z along the side surface 45 and the chamfer portion 49 between the side surface 45 and the rear surface 43. Accordingly, the rear portion 92 may be positioned at an inner location than the side end portion 91 in the third direction Z with respect to the side end portion 91.

A portion of the side end member 200, positioned on the side end portion 91 in the third direction Z, is defined as a first portion 201, and a portion of the side end member 200, positioned on the rear portion 92 in the third direction Z, is defined as a second portion 202. In this case, the body 210 may be formed in the second portion 202.

That is, the body 210 may extend along the second direction Y on the rear portion 92 in the third direction Z.

The plurality of ribs 220 may be formed in the first portion 201. Also, the plurality of ribs 220 may be formed across the first portion 201 and the second portion 202.

That is, the plurality of ribs 220 may be arranged at intervals in the second direction Y on the side end portion 91 in the third direction Z, and at least one portions of the plurality of ribs 220 may be formed on the rear portion 92 in the third direction Z.

As described above, because the plurality of ribs 220 extend from the body 210 in the first direction X, the plurality of ribs 220 may be positioned on the side end portion 91 in the third direction Z, and at least one portion of the plurality of ribs 220 may be positioned on the rear portion 92 in the third direction Z, like the body 210, although the embodiment is not limited thereto.

In an embodiment, the plurality of ribs 220 may be positioned only at a location corresponding to the side end portion 91 in the third direction Z, and the body 210 may be positioned only at a location corresponding to the rear portion 92 in the third direction Z.

Each of the plurality of ribs 220 may include a front end portion 221 positioned on the side end portion 91 in the third direction Z and forming a front end of the rib 220 in the first direction X, and a rear end portion 222 positioned on the rear portion 92 in the third direction Z, forming a rear end of the rib 220 in the first direction X, and connected with the body 210.

Because the front end 221 of each of the plurality of ribs 220 is positioned on the side end portion 91 and the rear end 222 is positioned on the rear portion 92, the plurality of ribs 220 may extend in the first direction X to be positioned on the rear portion 92 through the side end portion 91.

The body 210 may overlap with the metal plate 60 in the first direction X and be in contact with the metal plate 60. Accordingly, charges generated by an electrostatic discharge and then entered the side cover 90 may be guided to the metal plate 60 through the side end member 200.

A rear end of the body 210 in the first direction X may be in contact with the metal plate 60, and a front end of the body 210 in the first direction X may be positioned on the rear portion 92 in the third direction Z.

Because the plurality of ribs 220 are arranged at intervals in the second direction Y, as described above, the side end member 200 may include a plurality of spaces 230 formed between the plurality of ribs 220.

The plurality of spaces 230 may be spaces in which a plurality of ribs 220 formed on the side end portion 91 of the third display module 30B are inserted, which will be described below.

Accordingly, each of the plurality of spaces 230 may have a width that is equal to or greater than a width of each of the plurality of ribs 220 in the second direction Y such that the plurality of ribs 220 formed on the side end portion 91 of the third display module 30B are inserted in the plurality of spaces 230.

Hereinafter, an arrangement structure for reducing a separation distance between the display modules 30A to 30P will be described in detail.

Figure 13:
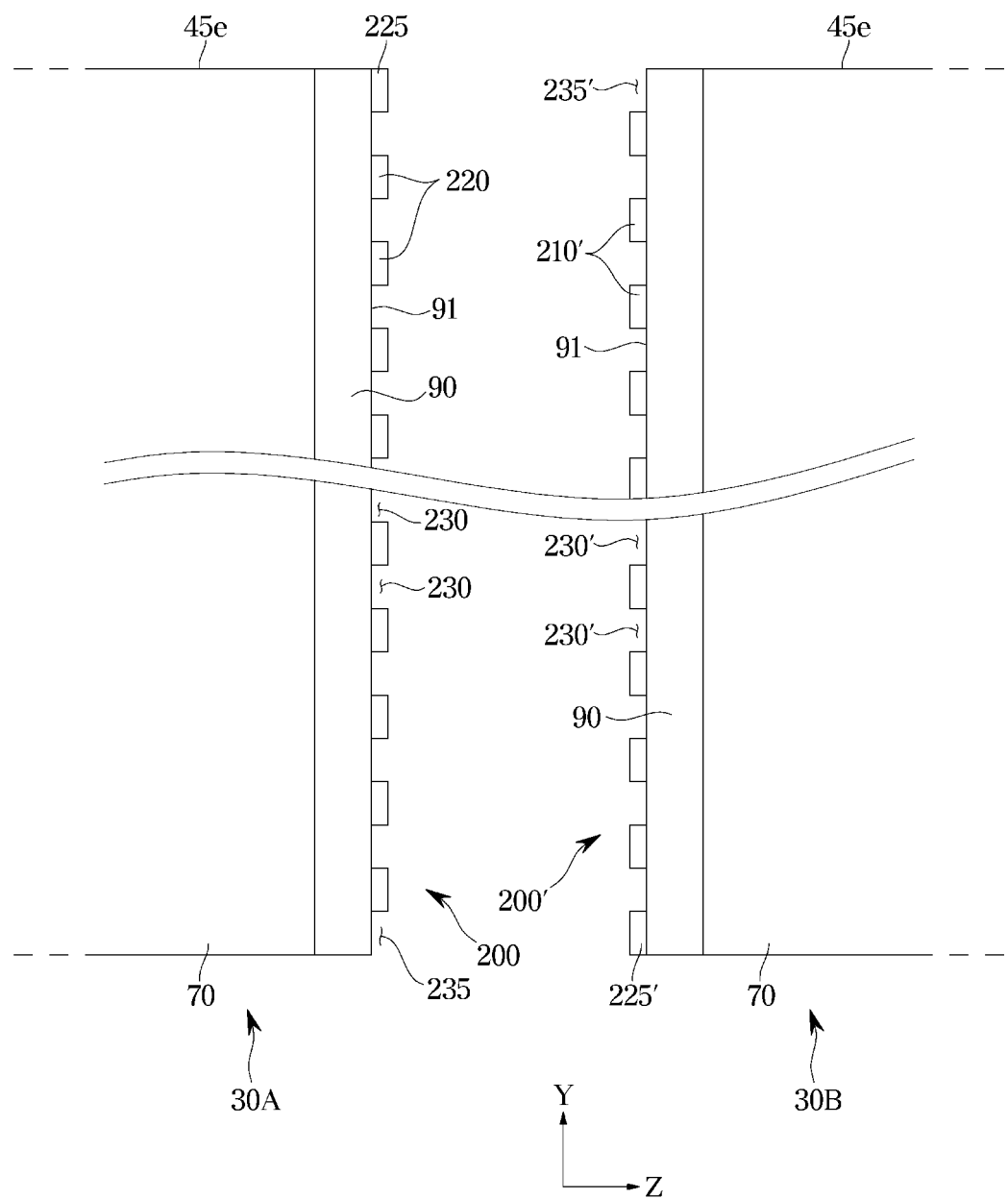
FIG. 13 schematically shows a process in which display modules of the display apparatus shown in FIG. 11 are arrayed according to an embodiment of the disclosure.
Figure 14:
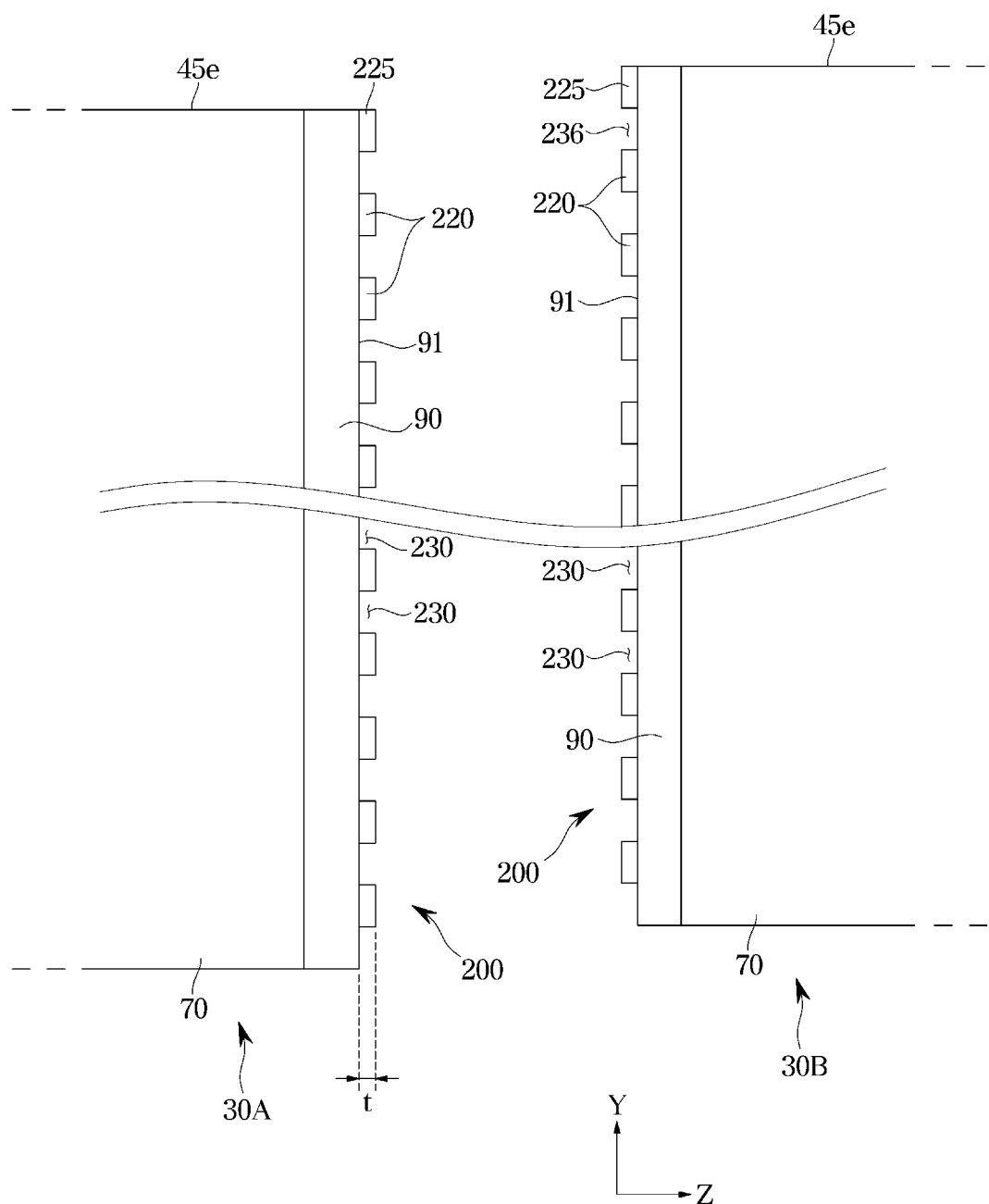
FIG. 14 schematically shows a process in which display modules of a display apparatus according to an embodiment of the disclosure are arrayed.
Figure 15:
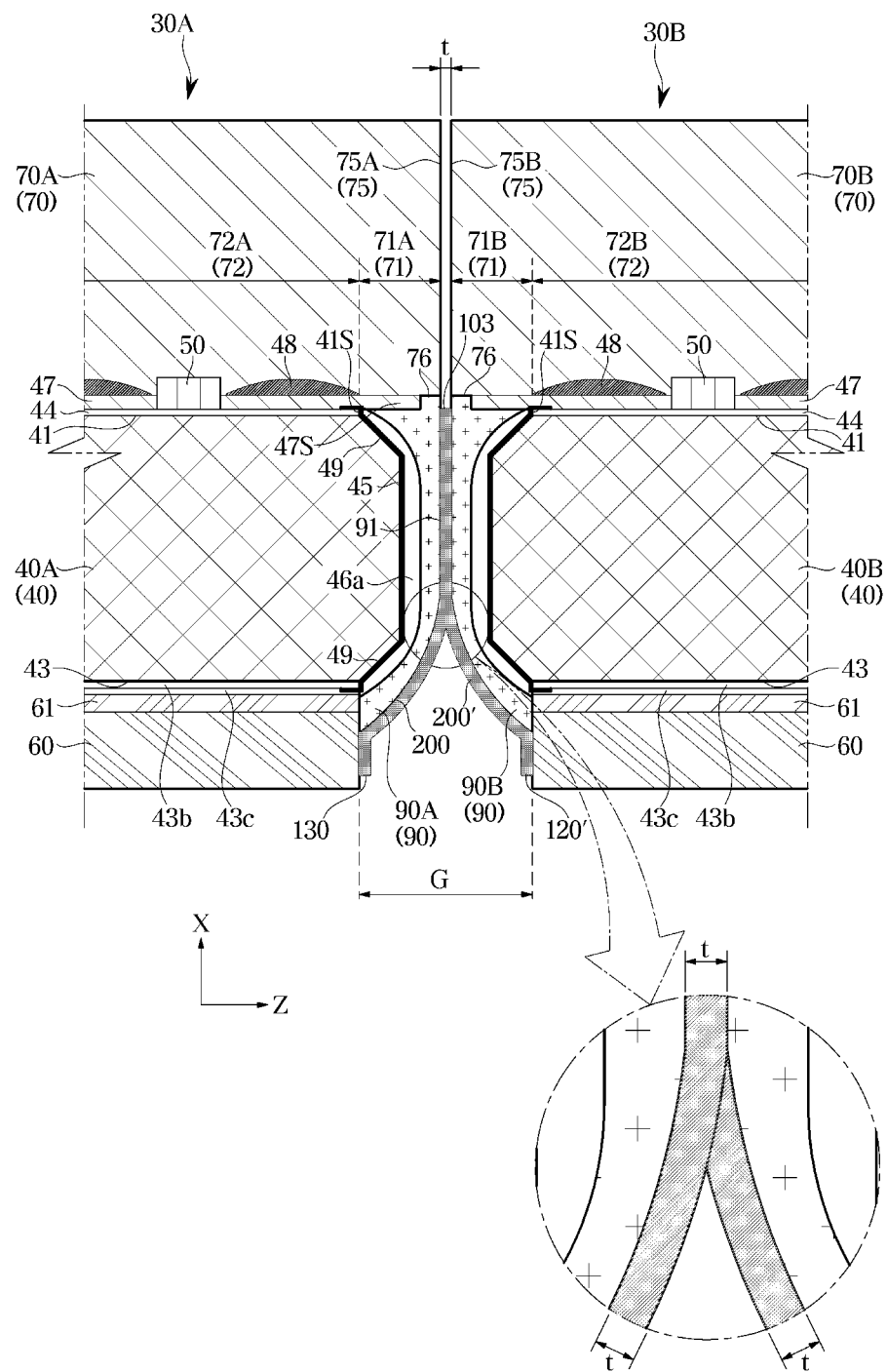
FIG. 15 is a cross-sectional view showing selected components of the display modules.

FIG. 13 schematically shows a process in which display modules of the display apparatus shown in FIG. 11 are arrayed, FIG. 14 schematically shows a process in which display modules of an embodiment are arrayed, and FIG. 15 is a cross-sectional view showing some components of the embodiment of a display module of FIG. 11, taken along the third direction.

As shown in FIGS. 13 and 14, because a plurality of ribs 220 are positioned at locations corresponding to the side end portion 91 in the third direction Z, the plurality of ribs 220 positioned on the side end portion 91 in the third direction Z may be protrusions arranged at intervals along the second direction Y.

As described above, a plurality of ribs 220 of the first display module 30A may be inserted into a plurality of spaces 230 of the third display module 30B in the third direction Z.

Accordingly, as shown in FIG. 15, a separation distance T between the first display module 30A and the third display module 30B may be equal to a thickness t of the side end member 200 in the third direction Z, and thus, the separation distance T between the first display module 30A and the third display module 30B may be reduced, resulting in a reduction of visibility of a seam between the first display module 30A and the third display module 30B.

As shown in FIG. 13, the side end member 200 of the first display module 30A may be positioned on the side cover 90 such that a first rib 225 is positioned at a front end in the second direction Y and a space (which may be referred to as a hindmost space) 235 is positioned at a rear end in the first direction X.

A side end member 200' of the third display module 30B may be positioned on the side cover 90 such that a space (which may be referred to as a foremost space) 235' is positioned at a front end in the first direction X and a first rib 225' is positioned at a rear end in the first direction X, reversely from the side end portion 200 of the first display module 30A.

A side end member such as the side end member 200 of the first display module 30A in which the first rib 225 is positioned at the front end in the second direction Y is defined as a side end member 200 of a first arrangement, and a side end member such as the side end member 200' of the third display module 30B in which the first rib 225' is positioned at the rear end in the first direction X is defined as a side end member 200' of a second arrangement.

In a case in which the first display module 30A is positioned to face the third display module 30B in the third direction Z, the plurality of ribs 220 of the first display module 30A may be positioned to correspond to a plurality of spaces 230' of the third display module 30B in the third direction Z. Accordingly, a front end 45e of the first display module 30A in the second direction Y and a front end 45e of the third display module 30B in the second direction Y may be positioned at the same height in the second direction Y such that the plurality of ribs 220 of the first display module 30A are inserted into the plurality of spaces 230' of the third display module 30B.

The front end 45e of the first display module 30A in the second direction Y and the front end 45e of the third display module 30B in the second direction Y may be formed as the side surface 45 of the substrate 40 or the side cover 90. For convenience of description, the front ends 45e are denoted by solid lines in FIGS. 13 and 14.

That is, when the side end member 200 of the first display module 30A and the side end member 200' of the third display module 30B are positioned in a state rotated by 180 degrees with respect to each other, the plurality of ribs 220 of the first display module 30A may be positioned to correspond to the plurality of spaces 230' of the third display module 30B on the same line in the third direction Z, and accordingly, the first display module 30A may be arrayed to correspond to the third display module 30B on the same line with respect to the first direction X.

As described above, the side end member 200' of the third display module 30B being adjacent to the first display module 30A may be positioned in a state of being rotated to 180 degrees in the first direction X with respect to the arrangement of the side end member 200 of the first display module 30A.

As shown in FIG. 14, each of the side end member 200 of the first display module 30A and the side end member 200' of the third display module 30B may be positioned in the first arrangement on the side cover 90 such that the side end member 200 of the first display module 30A is symmetrical to the side end member 200' of the third display module 30B in the third direction Z.

In this case, in the first display module 30A and the third display module 30B arranged in the third direction Z, the plurality of ribs 220 of the first display module 30A may be positioned to correspond to the plurality of ribs 220 of the third display module 30B on the same line in the third direction Z. Accordingly, in a case in which the first display module 30A is arrayed with the third display module 30B by positioning the front end 45e of the first display module 30A and the front end 45e of the third display module 30B at the same height in the second direction Y, the plurality of ribs 220 of the first display module 30A may be not inserted into the plurality of spaces 230 of the third display module 30B.

That is, in the case in which the side end member 200 of the first display module 30A is symmetrical to the side end member 200' of the third display module 30B in the third direction Z, the plurality of ribs 220 of the first display module 30A may be not positioned to correspond to the plurality of spaces 230 of the third display module 30B on the same line in the third direction Z. Therefore, the first display module 30A may be not arrayed to correspond to the third display module 30B on the same line with respect to the first direction X.

Accordingly, the first display module 30A may be arrayed with the third display module 30B in the third direction Z by intercrossing the front end 45e of the first display module 30A in the second direction Y with the front end 45e of the third display module 30B in the second direction Y, in the first direction X, instead of positioning the front end 45e of the first display module 30A and the front end 45e of the third display module 30B on the same line.

In this case, the first display module 30A and the third display module 30B may be arrayed in the third direction Z by positioning the third display module 30B at a higher location in the first direction X than the first display module 30A such that the first rib 225 of the first display module 30A is inserted into a first space 236 formed behind the first rib 225 of the third display module 30B in the second direction Y.

In example embodiments, any of the plurality of display modules 30A to 30P may have either or both of the side end members 200 and 200'. For example, in another embodiment, instead of the first display module 30A including a side end module 200 and the third display module 30B including a side end module 200', they may be reversed such that the first display module 30A includes a side end module 200' and the second display module 30E includes a side end module 200. In other example embodiments, any of the plurality of display modules 30A to 30P may have side end members 200 at one side and a side end member 200' at another side.

In the display apparatus according to an embodiment, each display module may be sealed by the front cover in the front direction, by the side cover at the side surface, and by the metal plate at the rear side, and by the side end member additionally positioned on the side surface and grounded to the metal plate, ESD internal pressure against an electrostatic discharge that may occur in the display module in a process of manufacturing and transferring the display module and after the display module is assembled into the display apparatus may be improved.

The display apparatus according to an embodiment may provide a seamless effect by which a seam between the display modules is invisible by improving a shape of the side end member of each display module to reduce a gap between the neighboring display modules.

While various embodiments have been particularly shown and described, it will be understood that various changes in form and details may be made therein without departing from the spirit and scope of the following claims.

What is claimed is:

1. A display module comprising:
   a substrate having a mounting surface on which a plurality of inorganic light-emitting diodes emitting light in a first direction are mounted, a side surface, and a rear surface being opposite to the mounting surface;
   a front cover bonded with the mounting surface of the substrate and covering the mounting surface in the first direction;
   a metal plate bonded with the rear surface of the substrate;
   a side cover surrounding the side surface of the substrate; and
   a side end member covering at least one portion of the side cover, and extending along the side surface of the substrate in a second direction that is orthogonal to the first direction,
   wherein the side end member comprises a body extending in the second direction, and a plurality of ribs extending from the body in the first direction and arranged at intervals along the second direction.

2. The display module of claim 1, wherein the side cover comprises:
   a side end portion forming a side end of the side cover, and
   a rear portion extending in a rear direction from the side end portion with respect to the first direction and positioned at an inner location than the side end portion in a third direction that is orthogonal to the first direction and the second direction, and
   wherein the body is provided on the rear portion in the third direction.

3. The display module of claim 2, wherein the plurality of ribs are provided on the side end portion.

4. The display module of claim 2, wherein the plurality of ribs are provided on the side end portion in the third direction and the rear portion in the third direction.

5. The display module of claim 4, wherein the body is formed at rear ends of the plurality of ribs.

6. The display module of claim 1, wherein a length of each of the plurality of ribs in the second direction is equal to or less than a length of a separation distance between the plurality of ribs in the second direction.

7. The display module of claim 1, wherein a conductivity of the side end member is greater than a conductivity of the side cover.

8. The display module of claim 1, wherein a color of the side end member is a black color.

9. The display module of claim 1, wherein the side end member comprises a metal material.

10. A display module comprising:
    a substrate having a mounting surface on which a plurality of inorganic light-emitting diodes are mounted, a side surface, and a rear surface being opposite to the mounting surface;
    a front cover bonded with the mounting surface of the substrate and covering the mounting surface of the substrate;
    a metal plate bonded with the rear surface of the substrate;
    a side cover surrounding the side surface of the substrate; and
    a side end member covering at least one portion of the side cover and at least one portion of the metal plate, the side end member comprising a first end portion, a second end portion spaced from the first end portion in a direction in which the mounting surface faces, and a side end portion extending from the first end portion to the second end portion and forming a side end;
    wherein the first end portion of the side end member covers at least one portion of the side end of the side cover,
    wherein the second end portion of the side end member contacts the metal plate and is grounded to the metal plate, and
    wherein the side end portion comprises mountains and valleys alternately arranged in the direction in which the mounting surface faces.

11. The display module of claim 10, wherein a mountain from among the mountains is provided at the first end portion, and
    wherein a valley among the valleys is provided at the second end portion.

12. The display module of claim 10, wherein a conductivity of the side end member is greater than a conductivity of the side cover.

13. The display module of claim 10, wherein a height of each of the mountains and a depth of each of the valleys are the same.

14. The display module of claim 13, wherein the mountains and the valleys have a same volume.

15. A display apparatus comprising:
a display module array comprising a plurality of display modules arranged in a matrix, wherein each of the plurality of display modules comprises:
a substrate having a mounting surface on which a plurality of inorganic light-emitting diodes in a first direction are mounted, a side surface, and a rear surface being opposite to the mounting surface;
a front cover bonded with the mounting surface of the substrate and covering the mounting surface of the substrate;
a metal plate bonded with the rear surface of the substrate;
a side cover surrounding the side surface of the substrate; and
a side end member covering at least one portion of the side cover and extending along the side surface of the substrate in a second direction that is orthogonal to the first direction,
wherein the side end member comprises a body extending in the second direction, and a plurality of ribs extending from the body in the first direction and arranged at intervals along the second direction.

16. The display apparatus of claim 15, wherein the plurality of display modules comprises a first display module and a second display module, and
wherein the side end member of the first display module engages the side end member of the second display module.

17. The display apparatus of claim 16, wherein a length of each of the plurality of ribs in the second direction is equal to or less than a length of a separation distance between the plurality of ribs in the second direction.

18. The display apparatus of claim 16, wherein the side cover comprises:
a side end portion forming a side end of the side cover, and
a rear portion extending in a rear direction from the side end portion with respect to the first direction and in a third direction that is orthogonal to the first direction and the second direction, and
wherein the body is provided on the rear portion.

19. The display apparatus of claim 18, wherein the plurality of ribs are provided on the side end portion.

20. The display apparatus of claim 18, wherein the plurality of ribs are provided on the side end portion in the third direction and the rear portion in the third direction.

* * * * *